United States Patent
Opower et al.

[11] Patent Number: 5,874,929
[45] Date of Patent: *Feb. 23, 1999

[54] APPARATUS FOR PRODUCING AN IMAGE

[75] Inventors: Hans Opower, Krailling; Uwe Becker; Uwe Brauch, both of Stuttgart, all of Germany

[73] Assignee: Deutsche Forschungsanstalt fuer Luft- und Raumfahrt e.V., Germany

[ * ] Notice: This patent issued on a continued prosecution application filed under 37 CFR 1.53(d), and is subject to the twenty year patent term provisions of 35 U.S.C. 154(a)(2).

[21] Appl. No.: 425,123

[22] Filed: Apr. 19, 1995

[30] Foreign Application Priority Data

Apr. 20, 1994 [DE] Germany ............. 44 13 829.6

[51] Int. Cl.$^6$ ............. G09G 3/00; H04N 5/64
[52] U.S. Cl. ............. 345/32; 348/750; 359/204
[58] Field of Search ............. 345/32; 359/204, 359/218; 348/758, 750, 757; 347/235, 183

[56] References Cited

U.S. PATENT DOCUMENTS

| | | | |
|---|---|---|---|
| 4,423,426 | 12/1983 | Kitamura | 359/218 |
| 5,143,577 | 9/1992 | Haas et al. | 358/132 |
| 5,274,396 | 12/1993 | Shimoda et al. | 347/183 |
| 5,321,718 | 6/1994 | Waarts et al. | 359/326 |
| 5,418,546 | 5/1995 | Nakagakiuchi et al. | 345/32 |
| 5,513,196 | 4/1996 | Bischel et al. | 372/22 |
| 5,534,950 | 7/1996 | Hargis et al. | 348/750 |
| 5,565,742 | 10/1996 | Shichao et al. | 313/257 |
| 5,596,339 | 1/1997 | Furness, III et al. | 345/8 |
| 5,614,961 | 3/1997 | Gibeau et al. | 348/750 |

FOREIGN PATENT DOCUMENTS

| | | |
|---|---|---|
| 0 587 228 | 3/1994 | European Pat. Off. . |
| 35 29 571 | 2/1987 | Germany . |
| 58-33753 | 7/1983 | Japan . |
| 4-25290 | 1/1992 | Japan . |

*Primary Examiner*—Amare Mengistu
*Attorney, Agent, or Firm*—Barry R. Lipsitz; Ralph F. Hoppin

[57] ABSTRACT

An image is produced in an image plane using a row of semiconductor laser emitters which provide a corresponding row of outlet spots as light sources. An optical projection system receives radiation from the outlet spots and the radiation on the image plane as one or more rows of images by virtue of the illumination of individual, adjacently located imaging spots. The optical projection system associates at least one outlet spot with each of the imaging spots, and simultaneously forms the image of the outlet spots of all of the semiconductor laser emitters of the row of light sources at the imaging spots associated therewith.

64 Claims, 12 Drawing Sheets

APPARATUS FOR PRODUCING AN IMAGE

BACKGROUND OF THE INVENTION

The invention relates to an apparatus for producing an image in an image plane that is visible in particular for a human eye, comprising a radiation source that produces in the image at least one row of images by virtue of the illumination of individual, adjacently located imaging spots by means of an optical projection system.

An apparatus of this type is known for example from the field of image production using gas lasers in which a laser beam from a gas laser is moved by means of the optical projection system in order to produce an image consisting of individual image points which is recognizable as a whole by the human eye. Apparatus of this type serve for example, not only for producing static images but also for producing moving images, such as television images for example, which have a large format and which, possibly, are also multi-colored.

The use of gas lasers of this type for the production of images requires heavy expenditure on the apparatus for the production of the laser beam and, moreover, involves great expense for the optical projection system in order to deflect the laser beam in a defined manner. Consequently, the object of the invention is to improve an apparatus of the type conventionally used in such a way that the production of the image is possible in the simplest possible manner and hence also that it is effected as economically as possible.

SUMMARY OF THE INVENTION

This object is achieved in an apparatus of the type described hereinabove in accordance with the invention in that there is provided a row of light sources comprising a plurality of semiconductor emitters for the illumination of the imaging spots of the row of images, that the optical projection system associates at least one outlet spot for the radiation from each semiconductor emitter with one of the imaging spots and that the optical projection system simultaneously forms the image of the outlet spots of all of the semiconductor emitters at the imaging spots associated therewith.

The advantage of the solution in accordance with the invention can be seen in that, on the one hand, the semiconductor emitters represent a simply constructed radiation source which is easy to operate and that, on the other hand, the envisaged multiplicity of semiconductor emitters of the row of light sources simplifies the optical projection system insofar as this can simultaneously form an image of all of the semiconductor emitters of the row of light sources at the imaging spots associated therewith, so that this opens up the possibility of illuminating each imaging spot during a time period which is longer than the time period that is usual for the illumination of an imaging spot in conventional television devices, if one presupposes that, in order to be recognizable as a whole for the human eye, the image has to be built-up within at least the time period that is usual in television devices and has to be repeated at at least the repetition frequencies that are usual in television devices.

Thereby, it is possible for example, to select the number of semiconductor emitters such that the optical projection system illuminates one section of the imaging spots of a row of images at one time point and another section at a later time point.

Within the sense of the invention, a row may run horizontally or vertically.

However, it is particularly advantageous, if the number of semiconductor emitters is so great that, at any one point in time, one outlet spot of a semiconductor emitter is exclusively associated with each imaging spot of the row of images, so that, at this time point, the optical projection system associates all of the imaging spots with at least one respective outlet spot by virtue of an imaging process and consequently one can dispense with the successive illumination of one or more imaging spots of the row of images known from the state of the art.

It is particularly expedient with the solution in accordance with the invention when the semiconductor emitters emit the radiation in the time period between two successive control time points. Here, the advantage can be seen in that, in contrast to the apparatus known from the state of the art, not only can a brief illumination of an imaging point occur at a single time point but, due to the fact that the optical projection system associates the plurality of semiconductor emitters with the imaging spots, it is possible to illuminate the imaging spots during the total period of the association.

For reasons to do with the control operation, it is particularly expedient here if the control time points succeed one another at constant time intervals.

An advantageous embodiment envisages that the semiconductor emitters emit the radiation with a variably adjustable intensity in order to illuminate the imaging spots in correspondence with the adjustable intensity.

With this variant, it has proved to be expedient for the semiconductor emitters to emit the radiation with the set intensity substantially unaltered between two control time points.

To this end, it is envisaged in propitious manner that the setting of the intensity of the radiation of each semiconductor emitter should occur at each control time point and, in particular, the possibility then exists of altering the intensity setting at the next control time point.

This solution has the great advantage that the whole time period between two successive control time points is available for illuminating the imaging spots associated with the outlet spots of these semiconductor emitters so that a substantially lower power of the individual semiconductor emitters suffices in order to achieve a particular illumination of an imaging point for the time-averaging human eye, in contrast to the solutions known from the state of the art in which, due to the jumping from imaging spot to imaging spot, only a very short period of time is available for illuminating this imaging spot and thus of attaining a desired intensity that is observed by the human eye when averaged over time.

As an alternative to this, it is provided that the semiconductor emitters, between the control time points, either emit the radiation with maximum intensity but with a variably adjustable duration or that they do not emit any radiation. This manner of controlling the semiconductor emitters has the advantage that a simple manner of operation, which is especially suitable for driving semiconductor emitters, is thereby possible.

Especially in an embodiment of this type, the setting of an average intensity, which is perceptible by a human observer, is effected by modulating the duration of the emission of the radiation.

Preferably here, the setting of the duration of the emission of the radiation occurs at each control time point so that the intensity, which is on average perceived by a human observer, can be constantly adjusted to be different.

With this example too, the advantage consists in that a substantially greater period of time is available for the illumination since, in the maximum case, the total period of time between two control time points is available for attaining the desired average intensity.

Up to now, no detailed indications have been given regarding the illumination of the imaging spots by the semiconductor emitters. Thus, in the simplest case, it is envisaged that each imaging spot can be illuminated by a single semiconductor emitter. However, only a monochrome image can be produced thereby.

In order to be able to produce a multi-colored image, it is preferably envisaged that each imaging spot can be illuminated by three semiconductor emitters, each of which emits radiation at a wavelength which is such that white light can be produced by superimposing the radiation from the three semiconductor emitters.

As regards the manner in which things are controlled when there are three semiconductor emitters illuminating one imaging spot, it is preferably provided that the three semiconductor emitters respectively illuminating one imaging spot can each be controlled at the same time in order to ensure that the wanted color is always perceived at the illuminated imaging spot.

Detailed indications have still not been given regarding the construction of the row of light sources. Thus, independently of the question as to whether an imaging spot can be illuminated by one or by three semiconductor emitters, it is preferably envisaged that the row of light sources comprise at least one row of semiconductor emitters which emit radiation of the same wavelength since a row of light sources of this type can be manufactured particularly easily, for example, by means of a so-called "array" of semiconductor emitters.

In the case where it is intended that a multi-colored image be produced, it is envisaged, in advantageous manner, that, for the illumination of the imaging spots of a row of images, the corresponding row of light sources comprise three rows of semiconductor emitters which run in parallel with one another whereby the semiconductor emitters of each row emit radiation of substantially the same wavelength. A collection of semiconductor emitters of this type, which emit radiation of the same wavelength, is likewise advantageous because it can be produced in the form of a so-called "array".

Up to now, no further indications have been given as regards the manner in which the semiconductor emitters are controlled. Thus, one advantageous embodiment provides that, of the semiconductor emitters of one row of light sources, at least those, which are associated with one tenth of the imaging spots of a row of images, can be controlled at the same control time point. A significant extension of the time for controlling the semiconductor emitters is thereby achieved.

It is still more advantageous, if at least those semiconductor emitters of each row of light sources, which are associated with one third of the imaging spots of a row of images, can be controlled simultaneously.

It is even better, if the semiconductor emitters, which are associated with all of the imaging spots of a row of images, can be controlled simultaneously.

Up to now, it has not been explained in detail how the simultaneous control of a plurality of semiconductor emitters is implemented. Thus one advantageous embodiment envisages that a buffer store, from which the control parameters can be read-out in parallel for the simultaneous control of a plurality of semiconductor emitters, be provided for the simultaneous control of the plurality of semiconductor emitters.

Preferably, for storing the control parameters, it is envisaged that the buffer store record the control parameters for the semiconductor emitters between the control time points.

It is preferably envisaged thereby, that the control parameters can be serially read-in to the buffer store.

In the simplest case, the production of the control parameters is effected by an image generator. Preferably, the image generator is so conceived that it generates the control parameters in serial fashion and reads them into the buffer store.

In order to create the possibility of controlling the semiconductor emitters in a defined manner between two control time points, it is preferably envisaged that a control means, which buffer stores the control parameter from one control time point to the next control time point, be associated with each semiconductor emitter.

Up to now, no detailed indications have been given regarding the construction of the optical projection system. Thus, one advantageous embodiment envisages that the optical projection system successively form an image of a row of light sources as a plurality of rows of images. This solution has the advantage that only one row of light sources is required in order to produce a two-dimensional image consisting of a plurality of rows of images.

An optical projection system of this type can be realized in advantageous manner in that it comprises a beam deflecting element which forms the image of a row of light sources as successive rows of images.

Here, the beam deflecting element is preferably a movable reflecting element.

Preferably, this reflecting element can be moved in such a manner that it is movable into defined angular positions which respectively form the image of a row of light sources in a respective one of the rows of images.

One possible solution would be the use of a pivotal mirror.

A particularly expedient embodiment envisages that the beam deflecting element be formed by a rotating polygonal reflector.

A successive imaging of the row of light sources as a plurality of image rows can be realized particularly easily using a polygonal reflector of this type in that the polygonal reflector is made to rotate at a constant rotational speed.

Hereby, it is preferably envisaged that, for each surface of the polygon, the polygonal reflector traverse across the number of rows of images by rotation through a particular angular range and then changes over to the next surface of the polygon.

The production of the image functions particularly advantageously using a beam deflecting element if the optical projection system focuses the radiation from the semiconductor emitters of the row of light sources substantially onto the beam deflecting element.

In all of the embodiments in which a plurality of rows of images are produced from one row of light sources by the optical projection system, it is envisaged, in advantageous manner, that a time period of at least approximately 1 $\mu$s, advantageously at least approximately 5 $\mu$s, preferably at least approximately 10 $\mu$s, be available for the illumination of the imaging spots of a row of images.

This means, in the case where all of the semiconductor emitters associated with the imaging spots of a row of images are controlled at the same time, that the time intervals between two control time points likewise amount to at least approximately 1 $\mu$s, advantageously at least approximately 5 $\mu$s, preferably at least approximately 10 $\mu$s.

If only the semiconductor emitters associated with a section of the imaging points are controlled at the same time, then this number is multiplied by the fraction of the imaging spots of the row of images which are illuminated simultaneously. In the case of at least one tenth of the imaging points, there is available at least approximately 0,1 μs, advantageously at least approximately 0,5 μs, preferably at least approximately 1 μs, as the interval between two control time points.

As an alternative to the case that the optical projection system successively form the image of one row of light sources as a plurality of rows of images, it is envisaged that a row of light sources be associated with each row of images.

In this case, the optical projection system is constructed such that it forms the image of the plurality of rows of light sources as the plurality of rows of images.

Quite generally, no detailed indications of any sort have been given relative to the nature of the image forming quality of the optical projection system. Thus, one advantageous embodiment envisages that the optical projection system produce imaging spots which have a very small separation from each other in the longitudinal direction of the row of images by enlarging the outlet spots.

Preferably thereby, it is envisaged that the imaging spots substantially border onto one another.

The invention also relates in particular to an apparatus for the production of multi-colored images by illuminating different imaging spots with different colors wherein the color impression that is perceived by the human eye results from an arbitrary mixing of three basic colors, for example, a mixture of blue, green and red.

The apparatus in accordance with the invention serves, in particular, not only for the production of multi-colored static images but also for the production of multi-colored moving images.

When using three semiconductor emitters radiating different wavelengths for the illumination in color of an imaging spot during the production of an image having changing colors and which appears colored to the human eye, it is preferably envisaged that the optical projection system form the image of the radiation of the three semiconductor emitters, which radiate at different wavelengths, at one imaging spot.

Here, it is propitious if the optical projection system combines the radiation from the three semiconductor emitters, which radiate at different wavelengths, into one beam in order to simplify the formation of the image.

The radiation from the three semiconductor emitters, which respectively emit at different wavelengths and which determine the color of an imaging spot, is preferably combined into one beam before impinging on the deflecting element, which beam is then moved by the deflecting element from one imaging spot to the next.

As an alternative to this however, it is also conceivable that the radiation from the three semiconductor emitters, which emit at different wavelengths, should separately impinge on the deflecting element and an image be formed at a single imaging spot thereafter by the optical projection system, whereby, in this case, the optical projection system has to be constructed such that it forms an image of the radiation from the three semiconductor emitters at the imaging spots, for all of the imaging spots that are to be illuminated thereby.

As an alternative to this, it is envisaged that the optical projection system form an image of the radiation from the three semiconductor emitters, which radiate at different wavelengths, at three partial imaging spots which are arranged in a manner such that they are not congruent.

This solution is simpler insomuch as the expenditure required to achieve a congruent imaging of the radiation having different wavelengths for producing the imaging spots no longer applies and it is sufficient, in so far as the partial imaging spots are small enough, as to appear as one imaging spot of just one color to the human eye.

With this embodiment, it is advantageously envisaged that the radiation from the three semiconductor emitters, which emit at respectively different wavelengths and which determine the color of an imaging spot, should meet the deflecting element separately so that the latter also deflects the radiation separately.

Up to now, no detailed indications have been given as regards the semiconductor emitters. Basically, it is possible to utilize semiconductor light emitting diodes or even super radiators or electro-luminescent elements as the semiconductor emitters.

It has proved to be particularly advantageous if the semiconductor emitters comprise semiconductor lasers.

For this purpose, the types which are particularly expedient are the so-called edge emitters since these can be manufactured in simple and particularly economical manner as so-called "arrays" i.e. rows of semiconductor emitters on a substrate. These edge emitters are also well suited for subsequently disposed frequency multipliers.

As an alternative to this however, it is also advantageous if the semiconductor emitters are so-called vertical emitters which can likewise be arranged in a simple manner in the form of a matrix and that, when using these, it is possible, in particular, to effect a coupling with fiber optical elements, for example, frequency doublers.

Especially in those cases where the use of a semiconductor radiation source combined with a frequency doubler seems propitious for the advantageous production of radiation of the desired wavelengths, for example, the colors blue, green or red, a semiconductor emitter in accordance with the invention comprises a semiconductor radiation source, in particular a semiconductor laser, and a frequency doubler for the radiation emitted by the semiconductor radiation source.

Preferably thereby, the frequency doubler is constructed such that it comprises a waveguide structure which guides the radiation from each radiation source in compressed manner with a power density of at least $10^5 W/cm^2$ or compresses the radiation to said power density and a frequency doubling medium arranged in the waveguide structure.

The provision of a waveguide structure of this type enables the high power density necessary for the frequency doubling to be correctly maintained in the frequency doubling medium over a sufficiently long interaction length in a simple manner.

Here, the frequency doubler may be arranged relative to the radiation source in the greatest variety of ways. Thus, one advantageous embodiment envisages that an optical means, which focuses the radiation into the waveguide structure, be arranged between each radiation source and each frequency doubler in order to achieve the result that all of the diverging radiation emerging from the radiation source is coupled into the waveguide structure.

As an alternative to this, it is envisaged that the frequency doubler be directly adjacent to the respective radiation source. In this case, it is likewise ensured that substantially all of the radiation produced by the radiation source enters the subsequently disposed frequency doubler, especially when its waveguide structure is matched to the cross-sectional shape of the radiation emerging from the radiation source.

Moreover, this embodiment has the advantage that one can dispense with the provision and adjustment of an optical focusing means between the radiation source and the frequency doubler.

It is envisaged in one expedient embodiment that the radiation sources of a row of light sources be arranged in a row and the frequency doublers of the row of light sources be arranged, likewise in a row, at the output side of the radiation sources, preferably with the same separations as the radiation sources.

Preferably, the radiation sources can then be particularly easily and economically manufactured if a plurality of the radiation sources are arranged on a common substrate.

In like manner, the frequency doublers can then be economically manufactured if a plurality of frequency doublers are arranged on a common substrate.

A plurality of radiation sources and a plurality of frequency doublers can then be ideally combined, in particular, when these are respectively located on a common substrate at the same respective distances so that it is then possible therewith to arrange the frequency doublers directly adjacent to the radiation sources or with an intervening optical focusing means, whereby however, both the radiation sources and the frequency doublers are always located on a common optical axis.

Up to now, no detailed indications have been given as regards the type and the manner of construction of the waveguide structure. Thus, one advantageous embodiment envisages that the waveguide structure of each frequency doubler be a single mode waveguide.

No further indications have been given in connection with the previous description of the individual embodiments regarding the manner of construction of the waveguide structure itself. Thus, one advantageous embodiment envisages that the waveguide structure be formed by a wall material which surrounds the frequency doubling medium forming the core of the waveguide and which has a lower refractive index than the core of the waveguide. The waveguide structure can, in this way, be manufactured with the desired dimensions in a simple manner.

Preferably thereby, it is envisaged that the wall material be based on the same material as the frequency doubling medium and that it have a lower refractive index than this due to a different doping in order to obtain a guide for the radiation at the bordering surfaces between the wall material and the frequency doubling medium.

The manufacture of a waveguide structure of this type is possible in the greatest variety of ways. One advantageous embodiment envisages that the waveguide structure be formed by doping those regions that form the wall material, in a material which is identical to the frequency doubling medium. Starting with the material of the frequency doubling medium, this embodiment creates the opportunity for achieving the waveguide in a simple manner by doping the regions which it is intended should form the wall material for the waveguide.

A doping of this kind is possible, for example, by diffusion of doping elements. Doped regions of this type can then be manufactured in particularly advantageous manner when the waveguide structure is formed by layers which are applied to a substrate, preferably, a single-crystalline substrate, and which comprise the wall material.

In similar manner, the frequency doubling medium can then be manufactured in a simple manner when it is formed by a layer which is applied to a substrate.

Preferably, the substrate likewise consists of the material of the frequency doubling medium.

The use of a substrate has the particular advantage that a defined alignment of the optical axes of the frequency doubling medium is predeterminable by the alignment of the substrate insofar as this substrate is based on the material which is also provided for the frequency doubling medium.

In order to achieve the phase matching which is required for the frequency doubling, it is preferably envisaged that the frequency doubling medium be so formed, and, as regards its optical axes, it be so aligned relative to the channel of the waveguide that there results a non-critical phase matching, in the longitudinal direction of the waveguide structure, between the radiation which is produced and then coupled in by the radiation source and the radiation of double the frequency.

For the purpose of effecting this phase matching, it is preferably thereby envisaged that the frequency doubling medium can be brought up to a defined temperature and then retained thereat so that the optimum phase matching can be maintained following this once-only setting of the temperature.

As an alternative to this, it is envisaged in one advantageous embodiment that the frequency doubling medium be so formed, and be so aligned that there results a quasi-phase-matching in the longitudinal direction of the waveguide structure.

Further features and advantages of the invention form the subject matter of the following description as well as of the sketched illustration of some embodiments.

DETAILED DESCRIPTION OF THE INVENTION

Figure 1:
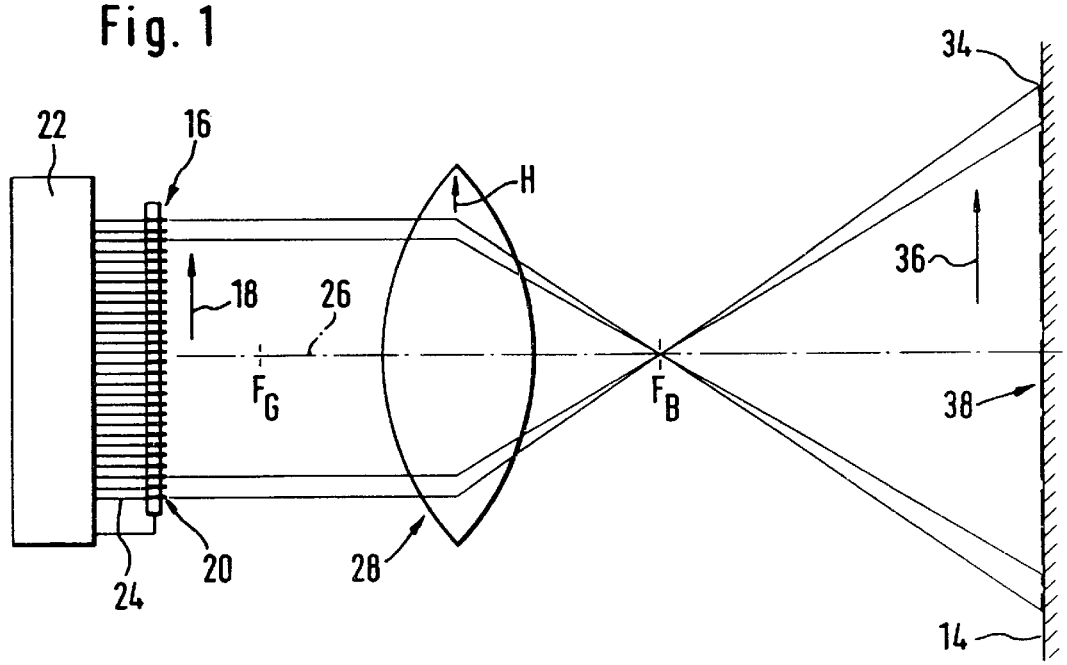
FIG. 1 shows a schematic top view of a first embodiment of an apparatus in accordance with the invention.
Figure 2:
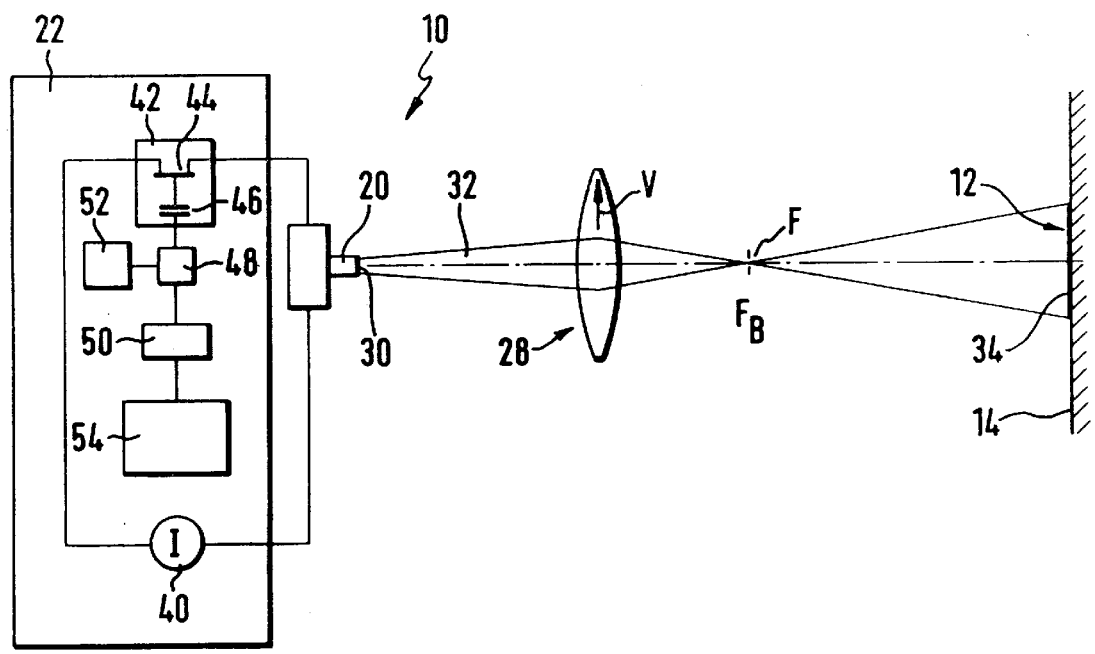
FIG. 2 a schematic side view of the first embodiment in accordance with FIG. 1 with an over-proportionately enlarged illustration of the optical imaging and a schematic illustration of the control means.

A first, simplest embodiment of an apparatus in accordance with the invention, which is illustrated in FIGS. 1 and 2 and which is referenced as a whole by 10, is used for the production of an image 12 on an image plane 14—for example, a projection plane on which the image is produced so that it can be perceived by a human eye—and it comprises a plurality of semiconductor emitters 20 which are arranged in a row of light sources 16 along the longitudinal direction 18 of the row of light sources 16 and which can be respectively individually controlled by a common control means 22 via individual control lines 24.

Here, the longitudinal direction 18 runs transversely to an optical axis 26 of an optical projection system which is referenced as a whole by 28 and which forms the image of an outlet spot 30 of each semiconductor emitter 20, from which the radiation 32 produced by the latter emerges, at an imaging spot 34 of the image plane 14 which is then illuminated by the radiation produced by the semiconductor emitter 20. Here, the optical projection system 28 is constructed such that the outlet spot 30 of each semiconductor emitter 20 is projected at a particular time point onto only a single imaging spot 34 in the image plane 14.

In the simplest case, as schematically illustrated in FIGS. 1 and 2, the optical projection system 28 is a lens which illuminates the imaging spot 34, by virtue of geometrical projection, with the radiation 32 that is emerging from the semiconductor emitter 20 with a small divergence, whereby the imaging spot 34 generally has a surface area which corresponds to a multiple of the outlet spot 30.

In the simplest case, in which the row of light sources 16 consists of individual semiconductor emitters arranged adjacent to one another in the longitudinal direction 18 and a simple lens represents the optical projection system 28, individual imaging spots 34, which together form a row of images 38, occur adjacent to one another in a longitudinal direction 36 on the image plane 14. Preferably, the optical projection system 28 is constructed such that the individual imaging spots 34 of the row of images 38 do not overlap in a direction corresponding to the longitudinal direction 36. Especially preferred is an implementation of the projection plane in which the imaging spots 34 succeed one another with their outer boundaries at only a small distance apart or where they border onto one another.

For the purposes of varying the brightness of the imaging spots 34 for the human eye observing the image 12 and as illustrated in FIG. 2, the control means 22 comprises a common current source 40 for all of the semiconductor emitters 20, which source supplies a current control block that is provided for each semiconductor emitter 20 and that comprises as a current controlling element, for example, an FET transistor 44 to whose gate there is connected a capacitor 46 as a storage element. This capacitor 46 in each current control block 42 can be charged up to a particular level of charge via a control switch 48 whereby the charge on the capacitor 46 determines the current through the FET transistor 44. For this, the charge that has to be stored in the capacitor 46 is read-out from a buffer store 50 for each capacitor 46 of each current control block 42 by triggering the control switch 48 from the buffer store 50, whereby the buffer store 50 preferably stores all of the control parameters and, due to the triggering of the control switch 48, all of the control parameters are read-in to the capacitors 46 of all the current control blocks 42 at the same time.

A trigger block 52 is provided for triggering the control switch 48.

Between the time points t, at which the trigger block 52 triggers the control switch 48, there is an opportunity to read in the individual control parameters serially into the buffer store 50 via an image generator 54 so that the buffer store 50 has stored the currently relevant control parameters for all of the semiconductor emitters 20 of the row of light sources 16 at each trigger time point t.

Figure 3:
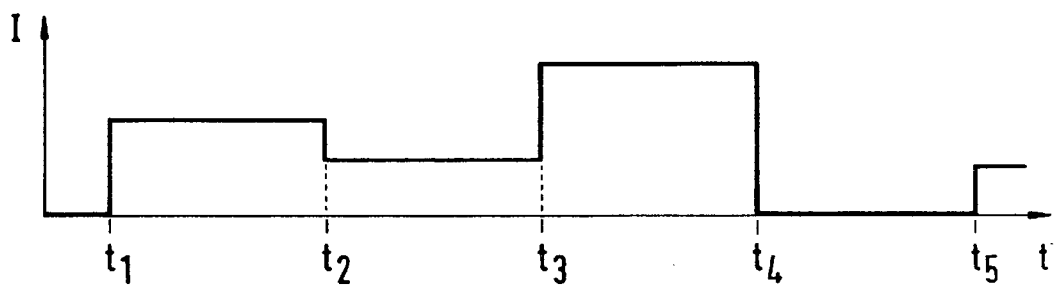
FIG. 3 a schematic illustration of the time dependence of the intensity of the radiation from a semiconductor emitter after different control time points.

If one now considers just one semiconductor emitter 20, the intensity of the radiation 32 emitted thereby can be determined at the control time point $t_1$ by correspondingly charging the capacitor 46 of the corresponding control block 42, as is illustrated in FIG. 3. The charge is retained thereafter in the capacitor 46 so that the intensity of the radiation from the semiconductor emitter remains constant up to the next control time point $t_2$. If, at this time point, the charge on the capacitor 46 is reduced, then this intensity too is retained up to the next control time point $t_3$. The maximum intensity and hence the maximum charge on the capacitor 46 is stored at the control time point $t_3$ for example, while the minimum charge is stored at the control time point $t_4$ so that, between the control time points $t_4$ and $t_5$, the semiconductor emitter 20 does not emit any radiation or emits only radiation having an intensity of 0.

Due to the fact that an individual control block 42 is provided for each semiconductor emitter 20, each individual semiconductor emitter 20 of the row of light sources 16 can now be individually controlled so that the image row 38 exhibits imaging spots 34 having markedly different intensifies.

Figure 4:
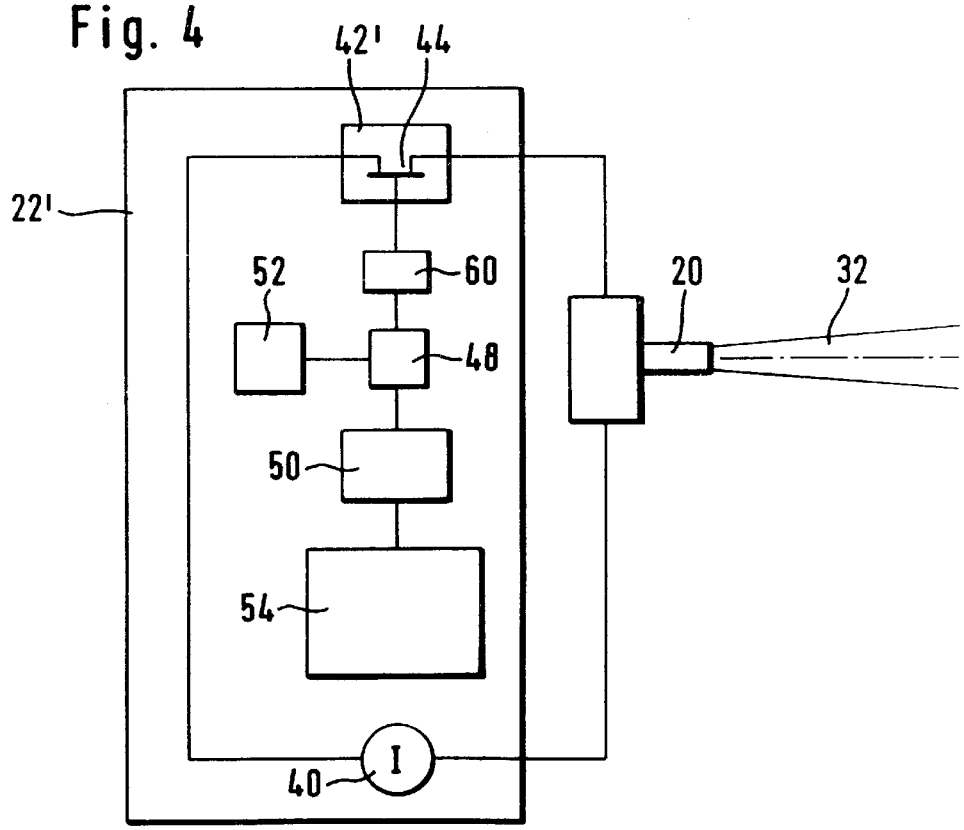
FIG. 4 a schematic illustration of one variant of the control means of the first embodiment in accordance with FIG. 2.

In an alternative embodiment of the control means 22' in accordance with the invention which is illustrated in FIG. 4, those components that are identical to those of the control means 22 are provided with the same reference symbols so that, as regards their description, reference is made to the full contents of the remarks relating to the control means 22.

Figure 5:
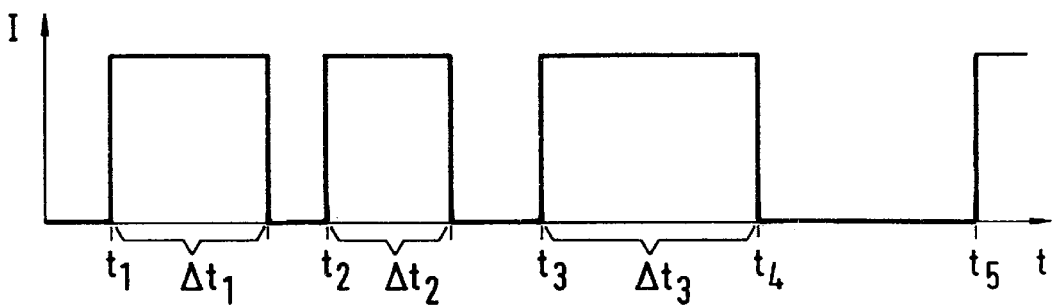
FIG. 5 a schematic illustration of the time dependence of the intensity of the radiation from a semiconductor emitter after different control time points.

In contrast to the control means 22, each control block 42' merely comprises the control transistor 44 whose gate is controlled by a pulse shaping stage 60 and which is merely switched between the states on and off. For its part, the pulse shaping stage stores the control parameters conveyed at the relevant control time point t and formats a control pulse for the control transistor 44, in correspondence with the control parameters, with different lengths in accordance with the pulse width modulation principle so that the semiconductor emitter 20 is also switched either on or off, but for durations of different length, between the respective control time points t as illustrated in FIG. 5.

The constant intensity values between the control points t1, t2, t3 and t4 are realized by means of pulse durations of different length $\Delta t_1$, $\Delta t_2$, $\Delta t_3$ whereby the semiconductor emitter emits radiation 32 having maximum power during each of the pulse periods $\Delta t_1$, $\Delta t_2$, $\Delta t_3$. Here, use is made of the effect that the human eye effects a time averaging when observing the imaging spot 34 and hence the different pulse widths $\Delta t_{12}$, $\Delta t_2$, $\Delta t_3$ convey to the human eye an impression as if the intensity values illustrated in FIG. 3 were present throughout the total time period between the control times $t_1$, $t_2$, $t_3$ and $t_4$. The control means 22' is otherwise constructed identically to the control means 22.

Figure 6:
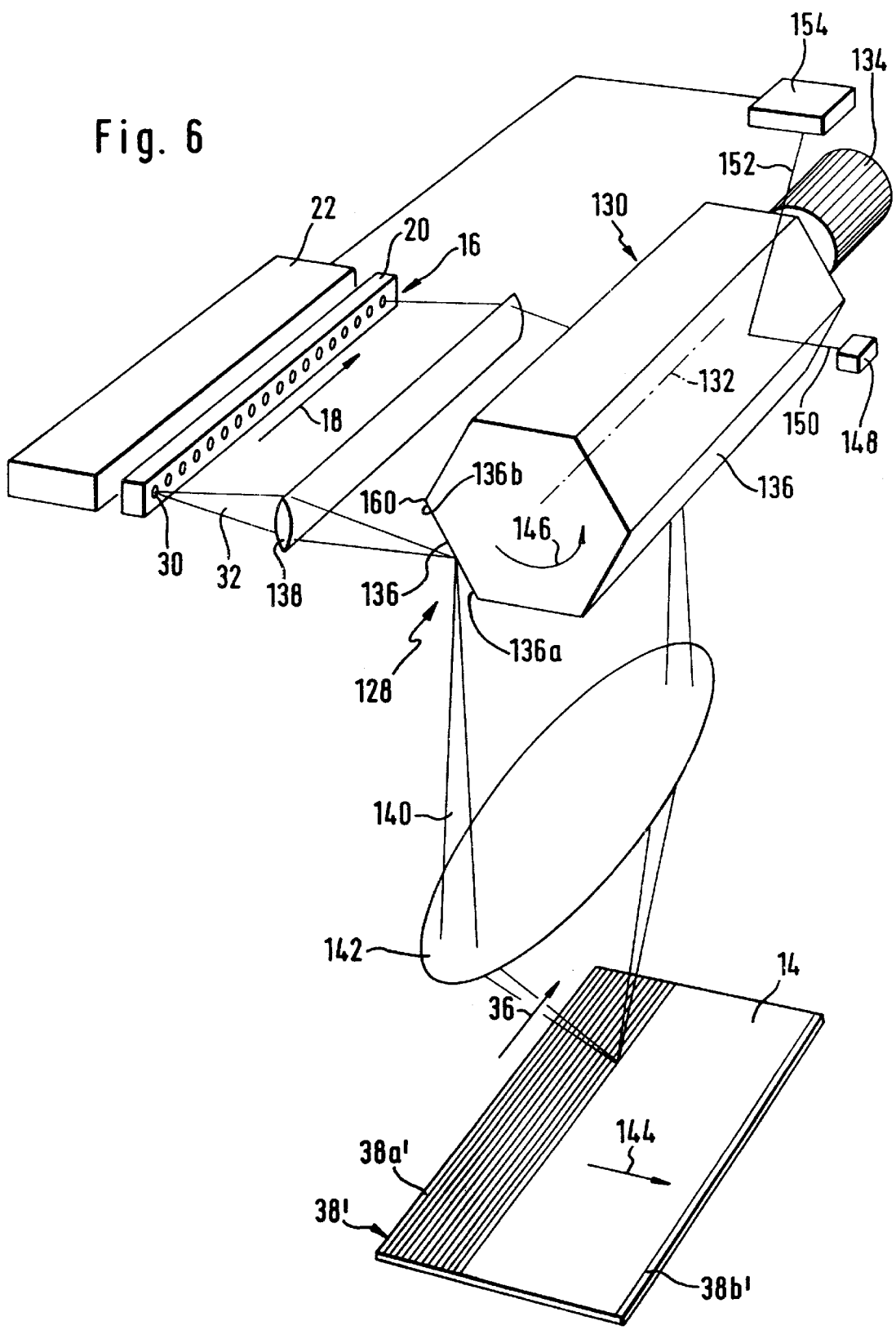
FIG. 6 a schematic, perspective illustration of a second embodiment.

In a second embodiment illustrated in FIG. 6, the optical projection system, which as a whole is referenced by 128, comprises a polygonal reflector 130 which is rotatably driven about an axis 132 by a drive means 134. For its part, the polygonal reflector 130 comprises a plurality of polygonal surfaces 136 which are arranged about the axis 132 at equal angular distances whereby one of the polygonal surfaces 136 serves as a reflecting surface on each occasion.

The row of light sources 16 comprises, in exactly the same way as in the first embodiment, a plurality of semiconductor emitters 20 which are arranged successively in the longitudinal direction 18 and are likewise controlled by a control means 22 or 22'.

The radiation 32 emerging from the outlet spots 30 is initially focused on the polygonal surface 136 which is in the reflection position by a first optical focusing means 138, and the radiation 140 reflected from the polygonal surface 136 which is in the reflection position is intermediately focused and its image is formed on the image plane 14 by a second optical focusing means 142.

Due to the fact that the polygonal surface 136 which is in the reflection position continues to rotate about the axis 132 for as long as it is irradiated by the radiation 32, not just one row of images 38 occurs on the image plane 14 but rather, there is produced a plurality of rows of images 38' which are arranged adjacent to one another in a transverse direction 144 running perpendicularly to the longitudinal direction 36. A first row of images 38a' is thereby then produced on the image plane 14 when the polygonal surface 136 which is in the reflection position is struck by the radiation 32 at its region 136a which is foremost in the direction of rotation and the last row of images 38b' is then produced when the polygonal surface 136 which is in the reflection position is struck by the radiation 32 at its region 136b which is rearmost in the direction of rotation 146 of the polygonal reflector.

Figure 7:
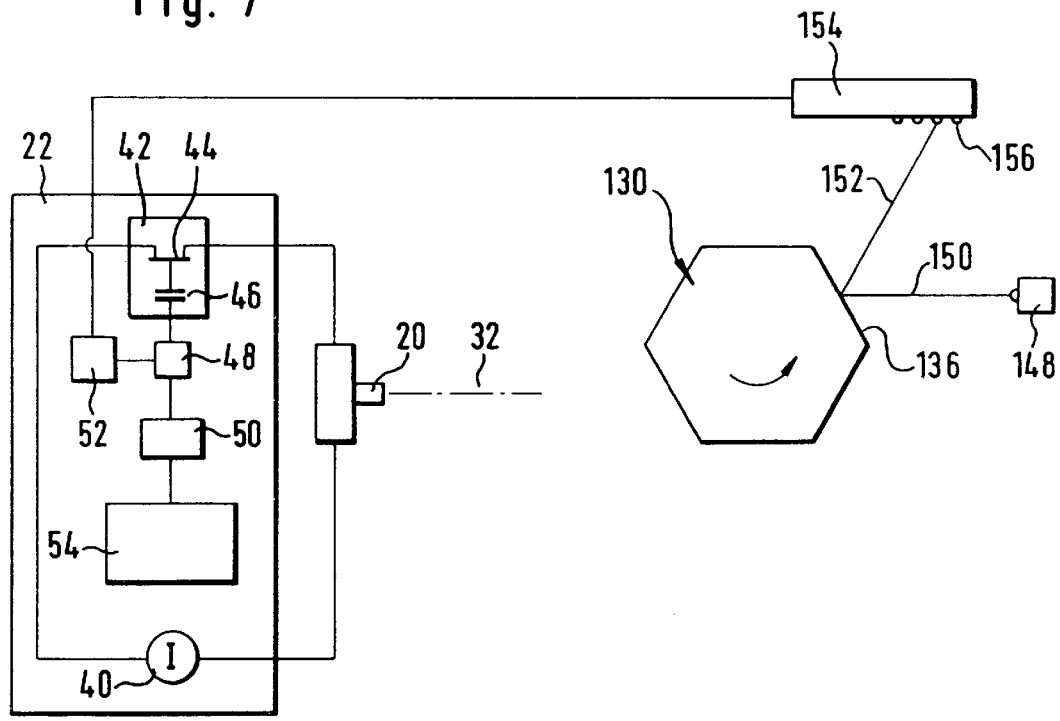
FIG. 7 a sectionally enlarged illustration of a synchronisation between a polygonal reflector and the control means in the second embodiment.

For the purposes of synchronisation of the rotating polygonal reflector 130 with the control means 22, there is provided, as illustrated in FIGS. 6 and 7, a further semiconductor emitter 148 which illuminates, by means of a light beam 150 for example, that polygonal surface 136 that is located opposite to the polygonal surface 136 which is in the reflection position, whereby the reflected radiation 152 meets a detector, which is referenced as a whole by 154 and which exhibits one detector region 156 or a plurality of detector regions 156, wherein the detector regions 156 have an expanse which corresponds approximately to the cross-section of the reflected radiation 152 so that a precise angular position of the polygonal reflector 130 is defined whenever the reflected radiation 152 strikes the respective detector region 156.

The first detector region 156 is, for example, positioned such that when the reflected radiation 152 impinges thereon, the polygonal surface 136 which is in the reflection position forms an image of the outlet spots 30 of the semiconductor emitters 20 of the row of light sources 16 on the first image row 38'a. Furthermore, the second detector surface 156 is preferably arranged such that, when the reflected radiation 152 impinges thereon, the polygonal surface 136 which is in the reflection position forms an image of the outlet spots 30 of the semiconductor emitters 20 of the row of light sources 16 on the second image row 38', and so on.

The impingement of the reflected radiation 152 on one of the detector regions 156 produces a signal in the detector 154 which is conducted for example to the trigger block 52 and causes this to trigger the control switch 48, if necessary, with an appropriate time displacement, so that the control parameter for each current control block 42 can be altered at these control time points t. The possibility thus exists of projecting imaging spots 34 having a different intensity distribution onto each image row 38' and hence of building-up on the image plane 14 a two-dimensional image which extends in the longitudinal direction 36 and the transverse direction 144 and which consists of the individual imaging spots 34 of the image rows 38'. The control time points t are thereby synchronized with the rotation of the polygonal reflector 130 such that they preferably coincide with the time points at which the radiation 32 would impinge on an edge 160 located between two polygonal surfaces 136.

Figure 8:
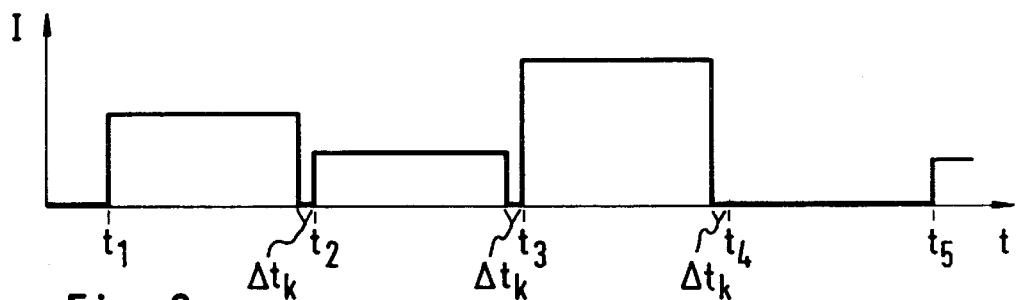
FIG. 8 a schematic illustration of the time dependence of the intensity, similar to FIG. 4, when using the control means of the second embodiment.

It is particularly advantageous thereby, if, at the time point at which the radiation 32 would impinge directly on the edge 160, all the semiconductor emitters were to be temporarily switched off during the time $\Delta t_k$ and hence emit no radiation 32 until such time as the polygonal surface 136 following the edge 160 is standing once more in a reflection position and is, in turn, reflecting the radiation 32 such that the outlet spots 30 of the semiconductor emitters 20 are located in the first image row 38'a. A method of control of this type is illustrated in FIG. 8 for the case of the control means 22. In this case, the control switch 48 has to be constructed such that it initially discharges the capacitor 46 at the relevant control time point t and then charges it up again with the correct control parameter that is stored in the buffer store 50.

Figure 9:
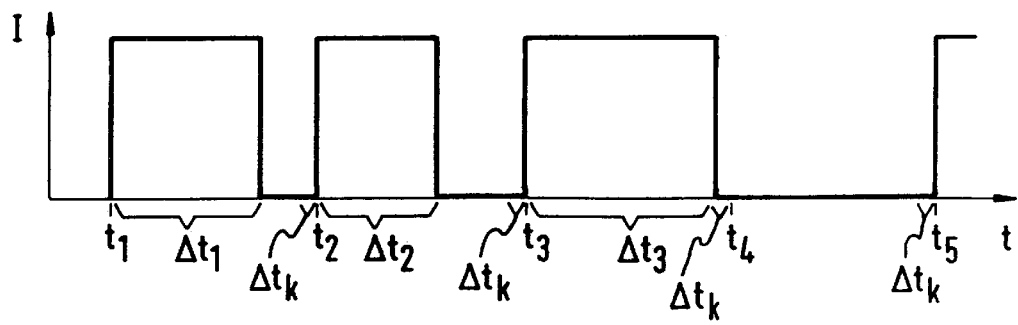
FIG. 9 a schematic illustration of the time dependence of the intensity, similar to FIG. 5, when using the variant of the control means described in connection with the first embodiment.

In the case of the control means 22', the switching-off of the semiconductor emitter 20 shortly before the relevant control time point t is easy to achieve, as is illustrated in FIG. 9, by making the maximum pulse width $\Delta t$ to be shorter in time by the amount $\Delta t_k$ than the time period between successive control time points t which preferably succeed one another at constant time intervals.

In the embodiment illustrated in FIG. 6, it is provided that the drive means 134 continuously rotates the polygonal reflector 130 at a substantially stabilized rotational speed.

It is conceivable, as an alternative to this, to provide a stepping motor as the drive means 134, which motor can be placed into individual rotational positions in a controlled manner and hence, it does not rotate the polygonal reflector 130 continuously, but rather, rotates it into respective rotational positions which are such that the polygonal surface 136 which is in the reflection position successively adopts different angular positions vis a vis the radiation 32 whereby each individual angular position corresponds to the reflection of the outlet spots 30 of the row of light sources 16 into one of the image rows 38' and hence the image rows 38' are illuminated during a defined time and thereafter the polygonal surface 136 which is in the reflection position "jumps" into the next rotational position. In this case, the possibility also exists of jumping over the edge 160 by virtue of a rapid rotation of the polygonal reflector 130.

The trigger block 52 can also be controlled in a manner corresponding to the control of the stepping motor so that one can dispense with the detection of the rotational position of the polygonal reflector 130 by means of the detector 154.

In the two previously described embodiments, it is provided that, for each row of light sources 16, individual semiconductor emitters 20 are located adjacent to one another in the longitudinal direction 18 and hence that the row of light sources 16 is formed by a single row of semiconductor emitters 20.

Figure 10:
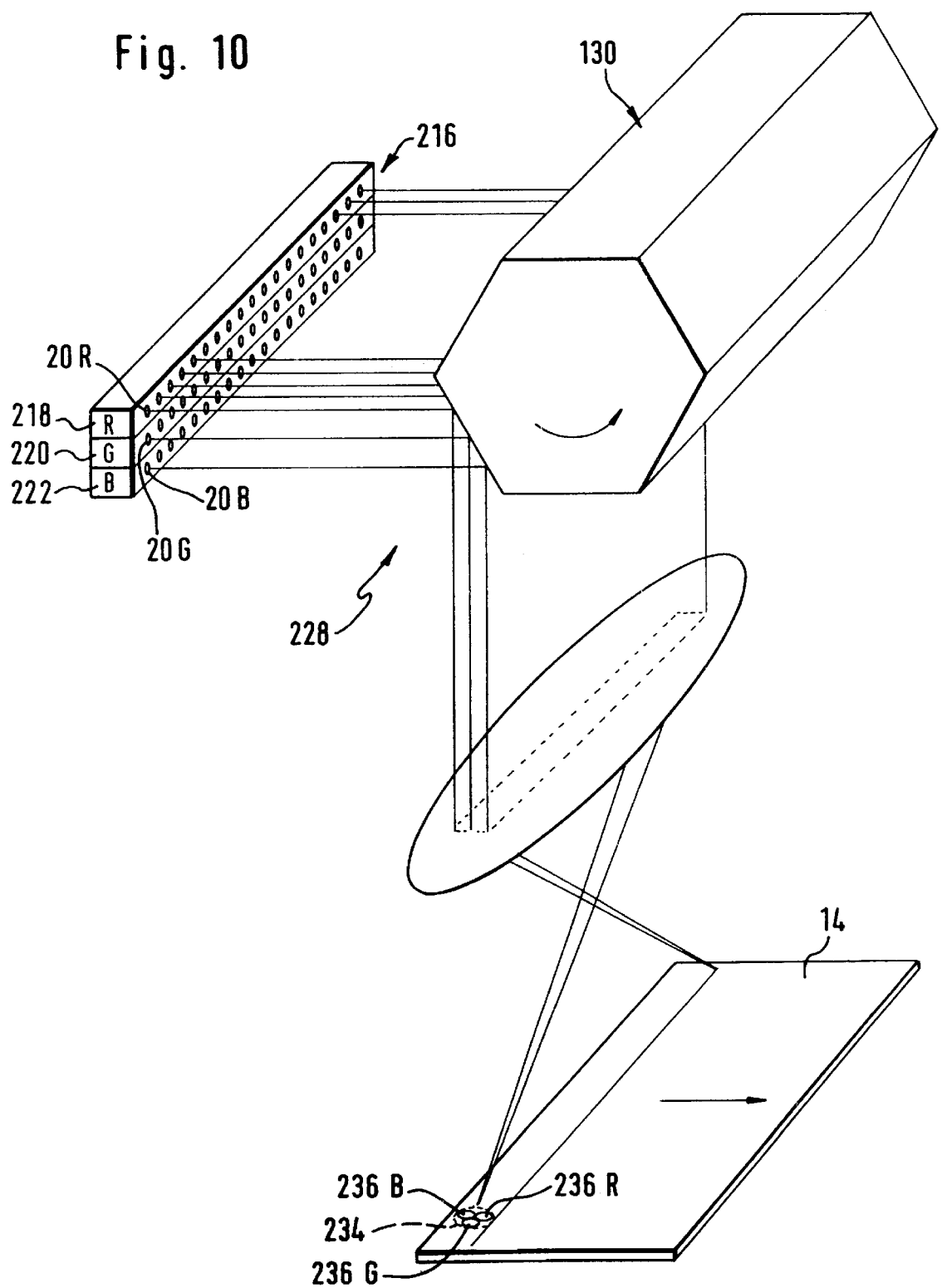
FIG. 10 a schematic illustration of a third embodiment of the apparatus in accordance with the invention.

In order to provide a multi-colored image for the human eye—a television picture for example, it is provided in a third embodiment which is schematically illustrated in FIG. 10 that each row of light sources 216 comprise three rows 218, 220 and 222 of semiconductor emitters 20 which run in parallel with one another, wherein the row 218 is built-up of semiconductor emitters 20R which emit red light, the row 220 is built-up of semiconductor emitters 20G which emit green light and the row 222 is built-up of semiconductor emitters 20B which emit blue light.

Here, the optical projection system 228 is constructed such that, in each case, a semiconductor emitter 20R, a semiconductor emitter 20G and a semiconductor emitter 20B illuminate one imaging spot 234 whereby, in the simplest case, it is provided that the partial imaging spots 236B, 236G and 236R produced by each of the semiconductor emitters 20R, 20G and 20B are not congruently superimposed but rather, such that for example, they only partially overlap or do not overlap at all. In the simplest case, one can then dispense with an intermediate focusing of the radiation 32 on the polygonal reflector 130 by means of the first optical focusing means 138 when using an optical projection system 228 of this type.

The optical focusing means 228 is otherwise constructed identically to the optical focusing means 128 of the second embodiment so that reference is made thereto as regards the individual details.

Moreover, the control of the rows 218, 220 and 222 of semiconductor emitters 20R, 20G and 20B occurs in an analogous manner to the various ways described in connection with the first embodiment whereby however, a buffer store 50 is required for each of the rows 218, 220 and 222 and a current control block 42 is required for each semiconductor emitter 20 but the control is effected in such a manner that the control parameters for the semiconductor emitters 20R, 20G and 20B of all three rows 218, 220 and 222 are read-out simultaneously from the buffer store at a control time point t.

In order to produce a colored image, the wavelengths of the semiconductor emitters 20R, 20G and 20B as well as the possible maximum intensifies are selected such that, as far as the human eye is concerned, every color, in particular, white too, can be produced in the imaging spots 234 by color mixing. To this end, three control parameters, i.e. one for each of the semiconductor emitters 20R, 20G and 20B illuminating these imaging spots 234 have to be produced by the image generator 54 for each imaging spot 34.

Figure 11:
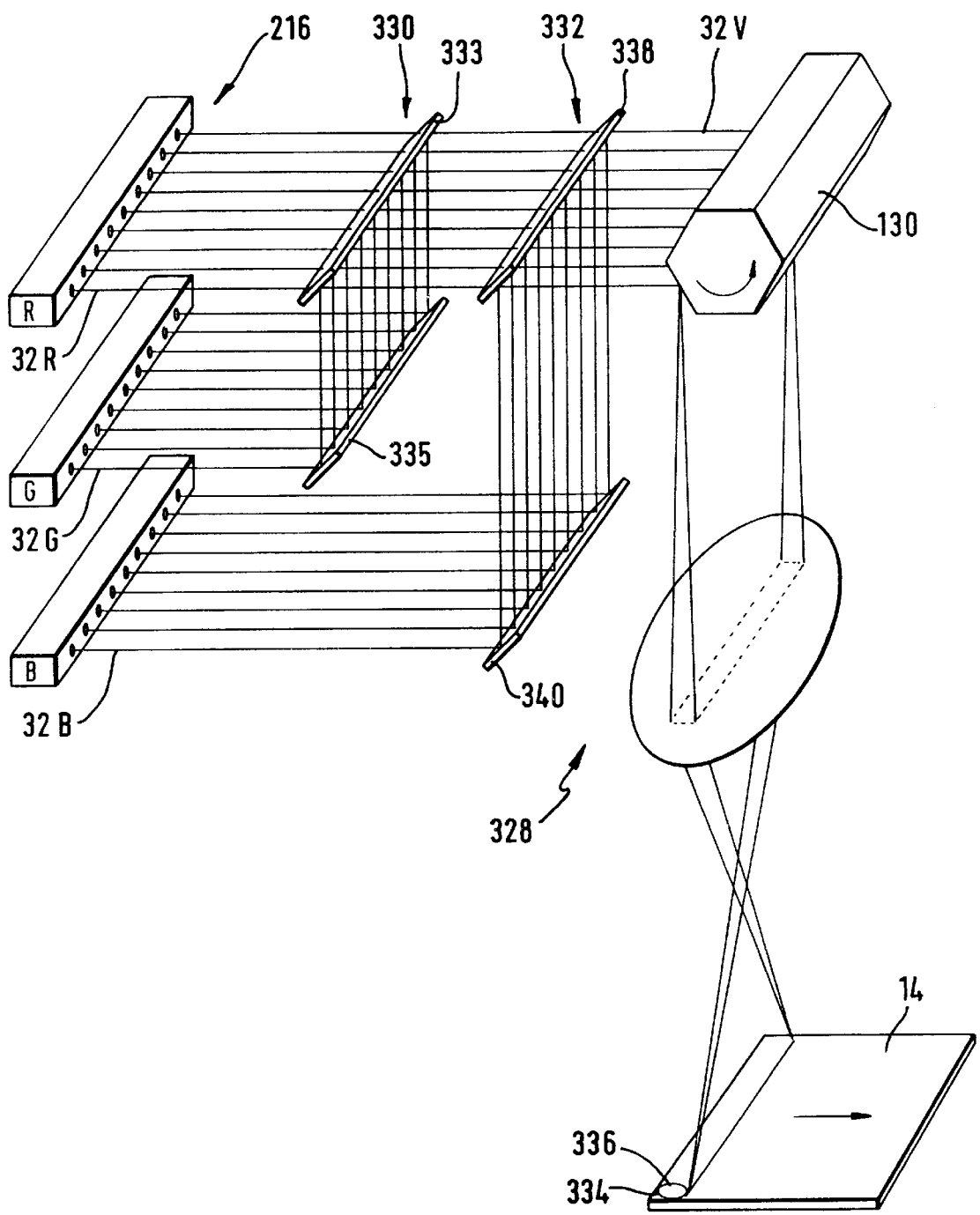
FIG. 11 a schematic illustration of a fourth embodiment of the apparatus in accordance with the invention.

In a fourth embodiment illustrated in FIG. 11, there are likewise provided -the three rows 218, 220 and 222 which respectively comprise the semiconductor emitters 20R, 20G and 20B. The control thereof likewise occurs as described in connection with the third embodiment.

In contrast to the third embodiment, the optical projection system 328 comprises two respective sets of mirrors 330 and 332 between the row of light sources 216 and the polygonal reflector 130 in order to combine the radiation 32R from the semiconductor emitters 20R, the radiation 32G from the semiconductor emitters 20G and the radiation 32B from the semiconductor emitters 20B together.

The first set of mirrors 330 comprises a dichroic mirror 33 arranged in the beam path of the radiation 32R and a mirror 335 which reflects the radiation 32G onto the dichroic mirror 333. The second set of mirrors 332 comprises a dichroic mirror 338 arranged in the beam path of the radiation 32R and a mirror 340 which reflects the radiation 32B onto the dichroic mirror 338.

Consequently, the radiation 32R, 32G and 32B is combined by the two dichroic mirrors 333 and 338 into the radiation 32V which meets the polygonal reflector 130 and is reflected by the latter onto the image plane 14 as was already described in connection with the second embodiment. The advantage of this optical projection system 328 can be seen in that, for each imaging spot 334 in this embodiment, the partial imaging spots 336, which are produced by the formation of the image of the outlet spots 30 of the semiconductor emitters 20R, 20G and 20B, can be superimposed upon one another in a substantially congruent manner.

Figure 12:
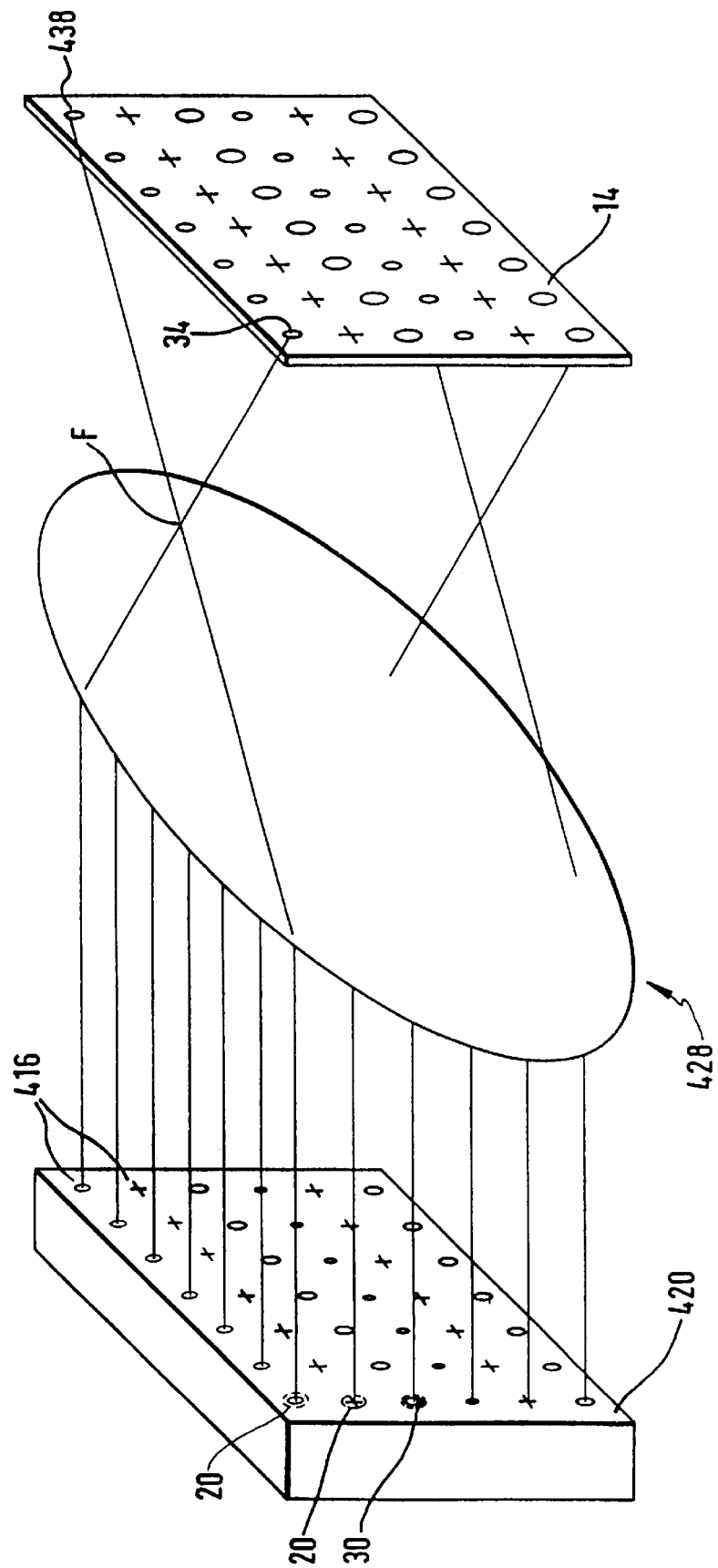
FIG. 12 a schematic illustration of a fifth embodiment of the apparatus in accordance with the invention.

In a fifth embodiment, which is illustrated in FIG. 12, a plurality of rows of light sources 416 of semiconductor emitters 20 are arranged in a two-dimensional matrix 420 and the optical projection system 428 is constructed such that it forms an image of each outlet spot of each semiconductor emitter 20 as an imaging spot 34 on the image plane 14 so that the image rows 438 including the adjacently located imaging spots correspond to the row of light sources 416 having the adjacently located outlet spots 30 of the semiconductor emitters 20 whereby each imaging spot 34 corresponds to an outlet spot 30 of the corresponding semiconductor emitter 20. Here, the optical imaging system 428 is preferably an optical lens system which forms an image of the outlet spots 30 of the semiconductor emitters 20 as enlarged imaging spots 34 on the image plane 14 via an intermediate focal point F.

Consequently, a monochromic two-dimensional image, which is formed by the imaging spots 34 of the image rows 438 on the image plane 14, can be portrayed using semiconductor emitters 20 which emit radiation 32 of the same wavelength, by appropriate control thereof.

In order to produce the image, the possibility exists of letting all of the semiconductor emitters 20 of the matrix 420 radiate simultaneously whereby a control block 42 or 42' is provided for each semiconductor emitter 20. The control parameter for the respective current control block 42 or 42' may also be altered when the information in the image is changing.

However, it is also conceivable to successively drive the individual rows of Light sources 416 one after the other and hereby to switch onward from one row of light sources 416 to the next following row of light sources 416.

Moreover, it is possible to successively control the individual semiconductor emitters 20 of the individual rows one after the other in order to produce an image on the image plane 14 analogously to conventional television techniques.

Figure 13:
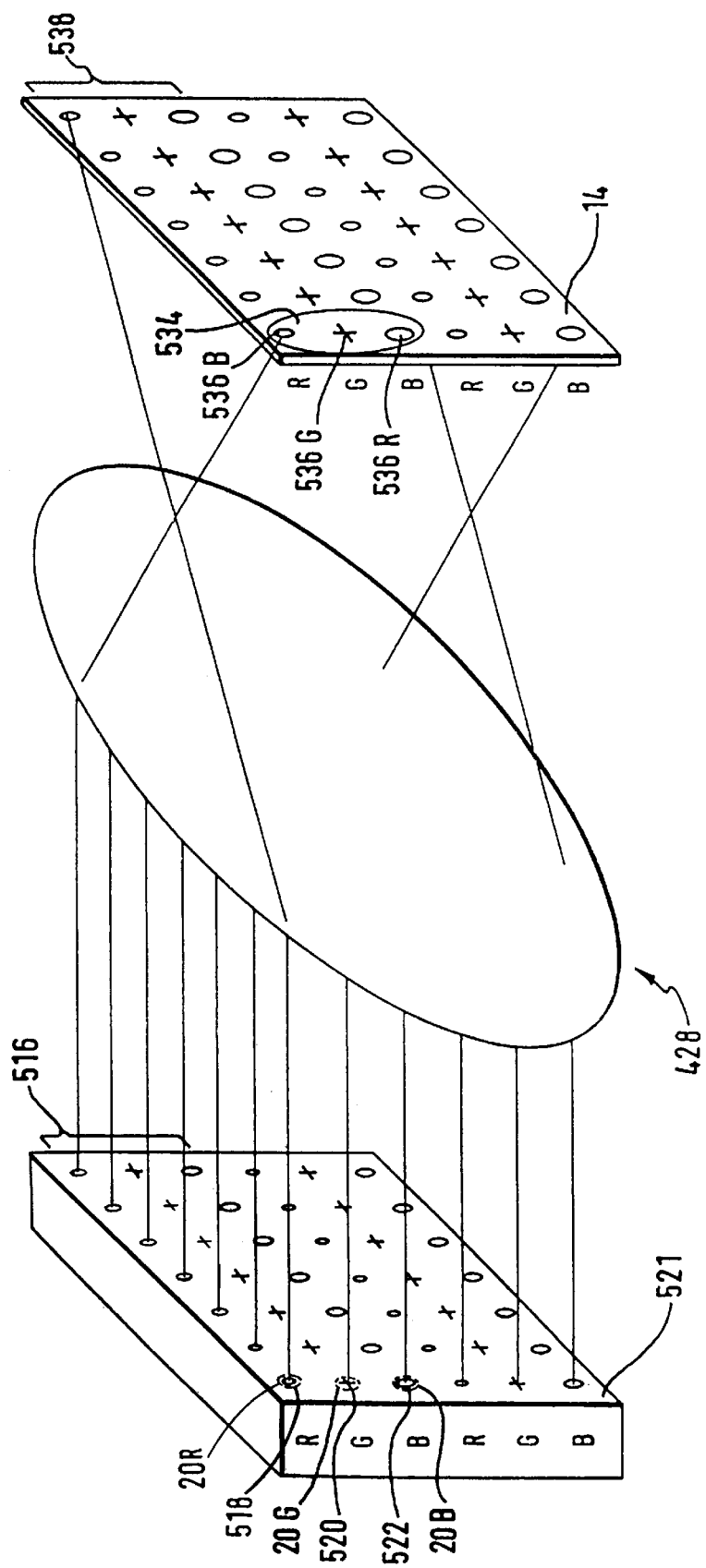
FIG. 13 a schematic illustration of a sixth embodiment of the apparatus in accordance with the invention.

In a sixth embodiment, which is illustrated in FIG. 13, the matrix 521 is built-up of semiconductor emitters such that each row of light sources 516 comprises three rows 518, 520 and 522 of semiconductor emitters 20R, 20G and 20B which respectively produce radiation of different wavelengths, for example, red, green and blue, so that, after their projection onto the image plane 14 by means of the optical projection system 428, the three rows 518, 520 and 522 of respectively monochrome semiconductor emitters 20R, 20G and 20B generate imaging spots 534 whose partial imaging spots 536R, 536G and 536B convey to the human eye a colored impression of an image by virtue of their very small separation, whereby the partial imaging spots 536R, 536G and 536B are located adjacent to one another or they only partially overlap. Consequently, the imaging spots 534 likewise form an image row 538.

Now, the matrix 521 comprises a plurality of rows of light sources 516 of this type which are arranged one above the other so that, when using the same optical projection system 428, there ensues a plurality of image rows 538 which are likewise arranged one above the other and this results in a two-dimensional image 12.

With this solution, the respective three semiconductor emitters 20R, 20G and 20B illuminating an imaging spot 534 have to be controlled simultaneously on each occasion in order to be able to produce the desired mixture of colors at the imaging spot 534.

Figure 14:
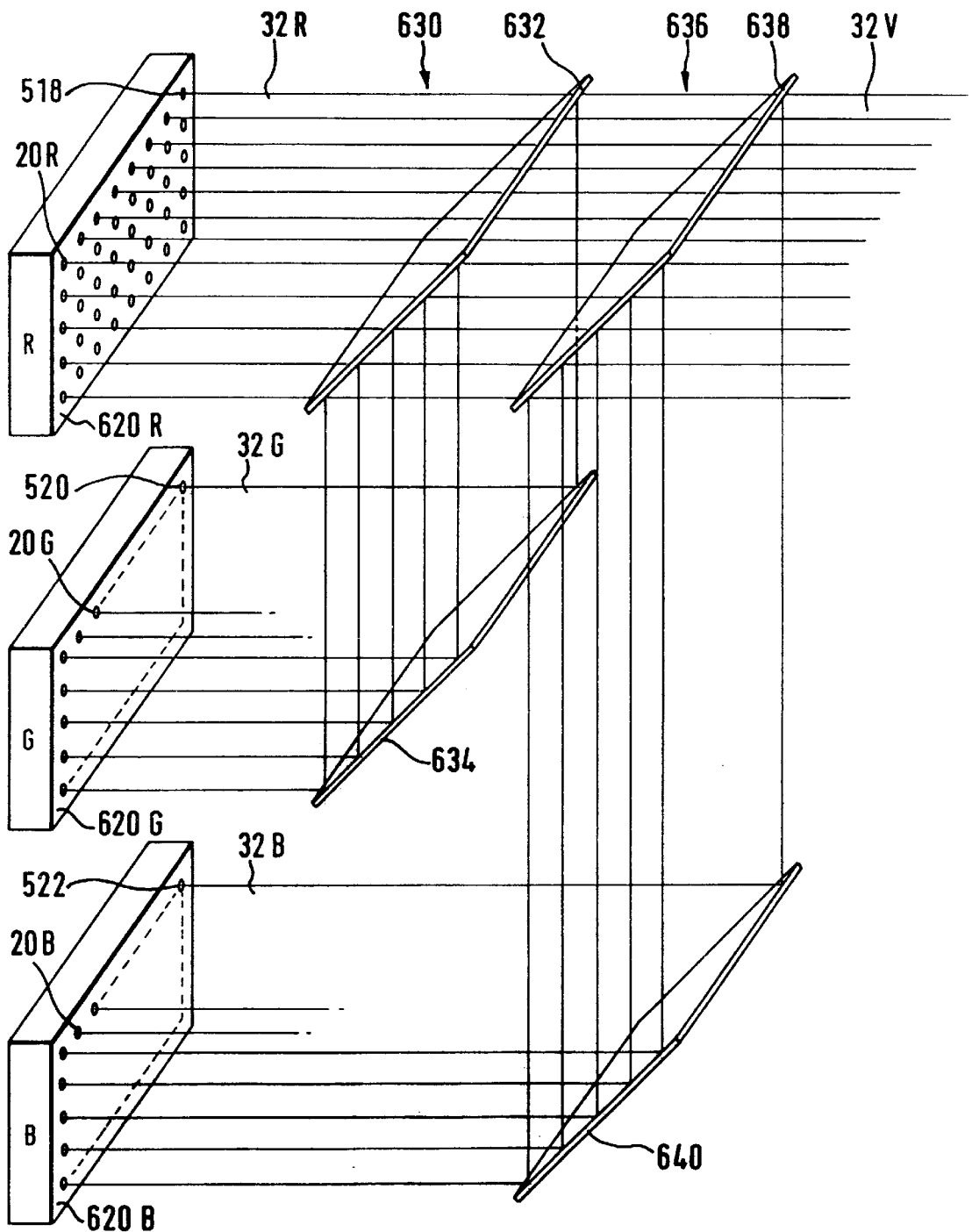
FIG. 14 a schematic illustration of a seventh embodiment of the apparatus in accordance with the invention.

As an alternative to the sixth embodiment which is illustrated in FIG. 13, it is provided in a seventh embodiment which is illustrated in FIG. 14 that the rows 518 of semiconductor emitters 20R be combined into a matrix 620R, the rows 520 of semiconductor emitters 20G into a matrix 620G and the rows 522 of semiconductor emitters 20B into a matrix 620B. The radiation 32R from the totality of the semiconductor emitters of the matrix 620R is now combined with the radiation 32G from the matrix 620G by means of a set of mirrors 630, in that a dichroic mirror 632 is arranged in the beam passage of the radiation 32R upon which a mirror 634 reflects the radiation 32G from the matrix 620G. In a similar manner, there is provided a set of mirrors 636 which likewise comprises a dichroic mirror 638 that is likewise in the beam path of the radiation 32R and upon which a reflecting mirror 640 reflects the radiation 32B from the matrix 620B so that the radiation 32V combines, in toto, all three radiations 32R, 32G and 32B, whereby, the sets of mirrors 630 and 636 have to be constructed such that the radiations 32R, 32G and 32B, each corresponding to the semiconductor emitters 20R, 20G and 20B, illuminate an imaging spot either through overlapping or by virtue of closely adjacent partial imaging spots and hence convey an overall impression of color.

The optical projection system in the seventh embodiment is otherwise constructed in the same manner as for the fifth and sixth embodiments so that one can make full reference thereto.

Figure 15:
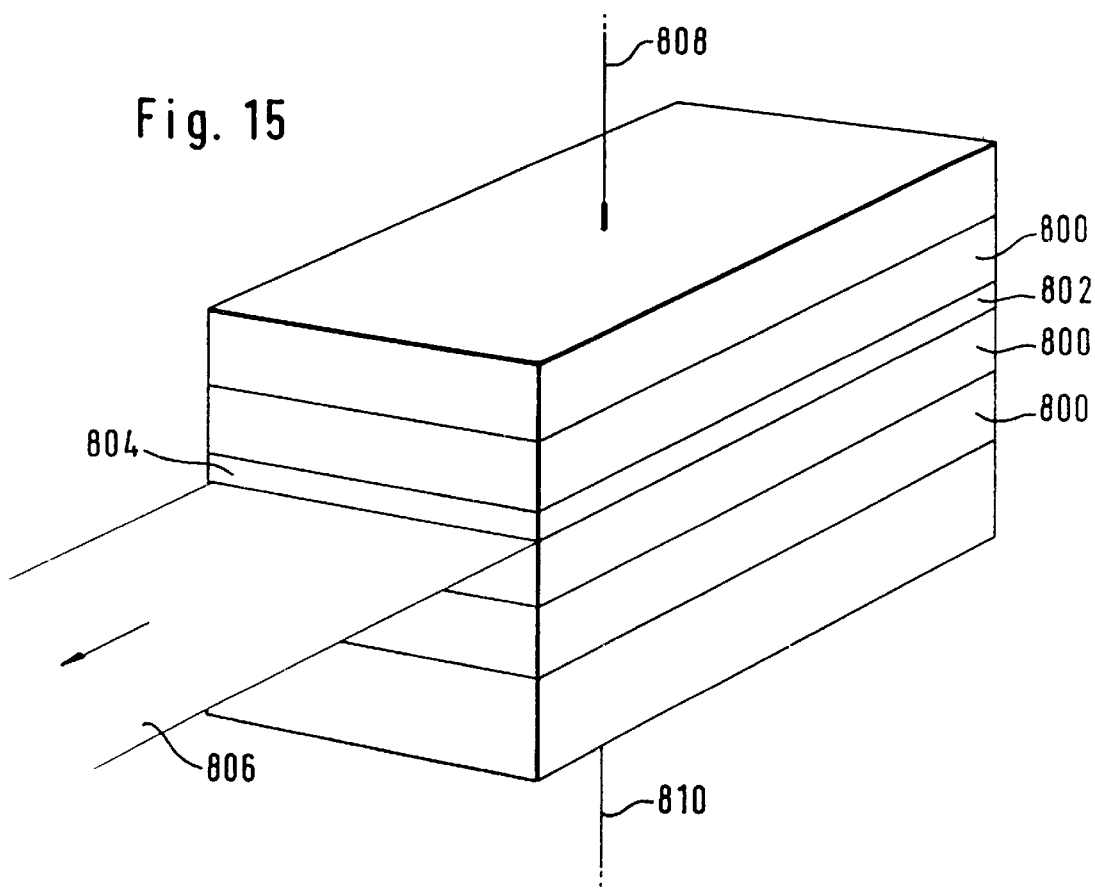
FIG. 15 a schematic illustration of a semiconductor emitter formed as an edge emitter.

In all of the previously described embodiments of the apparatus in accordance with the invention, the semiconductor emitters preferably comprise semiconductor lasers constructed as so-called edge emitters as the radiation sources as schematically illustrated in FIG. 15. Edge emitters of this type consist of a plurality of semiconductor layers 800 between which an active laser layer 802 is arranged. The laser radiation 806 emerges from this active laser layer in the region of an outlet spot 804.

An edge emitter of this type is driven by a current supply means via two current terminals 808 and 810 whereby the current flows substantially perpendicularly to the layers 800 and 802.

Embodiments of edge emitters of this type are described in detail in the periodical, Laser Focus World, July 1993, Vol 29, No 7, pages 83 to 92.

The advantage of these edge emitters can be seen in that they can be manufactured in a simple manner, adjacently located in rows, as a so-called array on a substrate.

Figure 16:
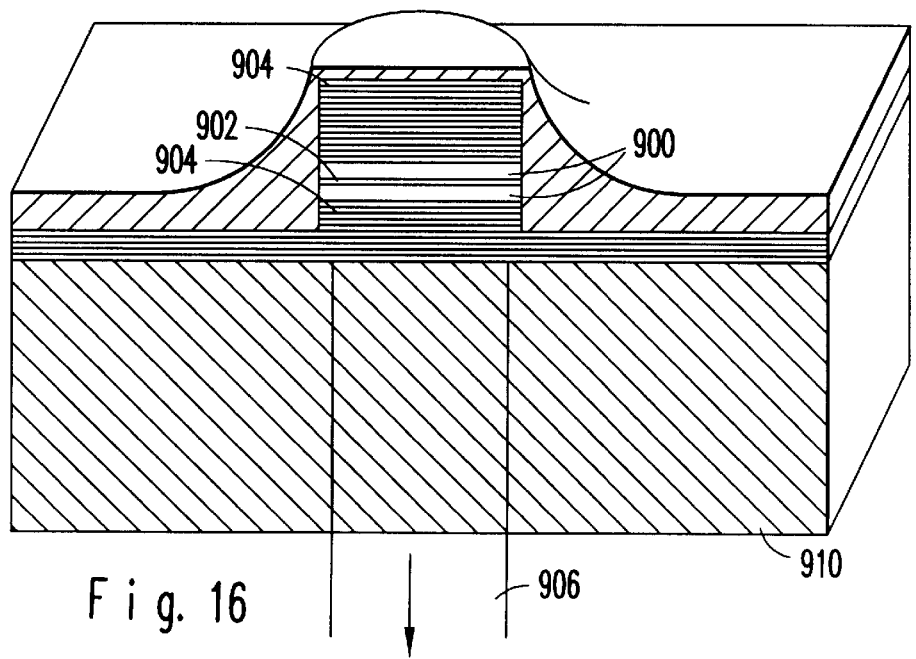
FIG. 16 a schematic illustration of a semiconductor emitter formed as a vertical emitter.

It is possible, as an alternative to the provision of edge emitters, to provide semiconductor lasers in the form of so-called vertical emitters as the radiation sources as illustrated in FIG. 16 wherein an active laser layer 902 is likewise provided between a plurality of semiconductor layers 900 in vertical emitters of this type and additional layers 904, which serve as Bragg reflectors, are provided on both sides of the active laser layer 902.

In vertical emitters of this type, the ensuing laser radiation does not propagate in parallel with the active layer 802 as for edge emitters, but rather, at right angles to the layer 902 and it passes through the substrate 910 and thereby preferably emerges perpendicularly to the plane of the substrate 910.

Vertical emitters have the advantage that the ensuing laser radiation 906 exhibits an approximately circular cross-section and hence coupling to other optical elements, fiber optical elements for example, can easily be effected.

Vertical emitters of this type are described for example, in the periodical, optics Letters, Vol 18, No 22, pages 1937 et seq. or, in the periodical, Spektrum der Wissenschaft, January 1992, pages 76 et seq. Reference is made to the full contents of these accounts.

As laser materials for the production of radiation having different colors in the visible range, use can preferably be made of the following laser materials:

$Al_xGa_yIn_{1-x-y}P$ on GaAs for 610–690 nm red $Zn_{1-x}Mg_xS_{1-y}Se_y$ on GaAs for 450–550 nm blue, green $Al_xGa_yIn_{1-x-y}N$ for UV-red As an alternative to these, the possibility exists of using other previously known laser materials and of doubling the wavelengths of the light produced. Materials of -this type would, for example, be:

$Al_xGa_{1-x}As$ on GaAs (780–880 nm) for blue $In_xGa_{1-x}As$ on GaAs (880–1100 nm) for blue, green $In_{1-x}Ga_xAs_yP_{1-Y}$ on InP (1100–1600 nm) for red.

Figure 17:
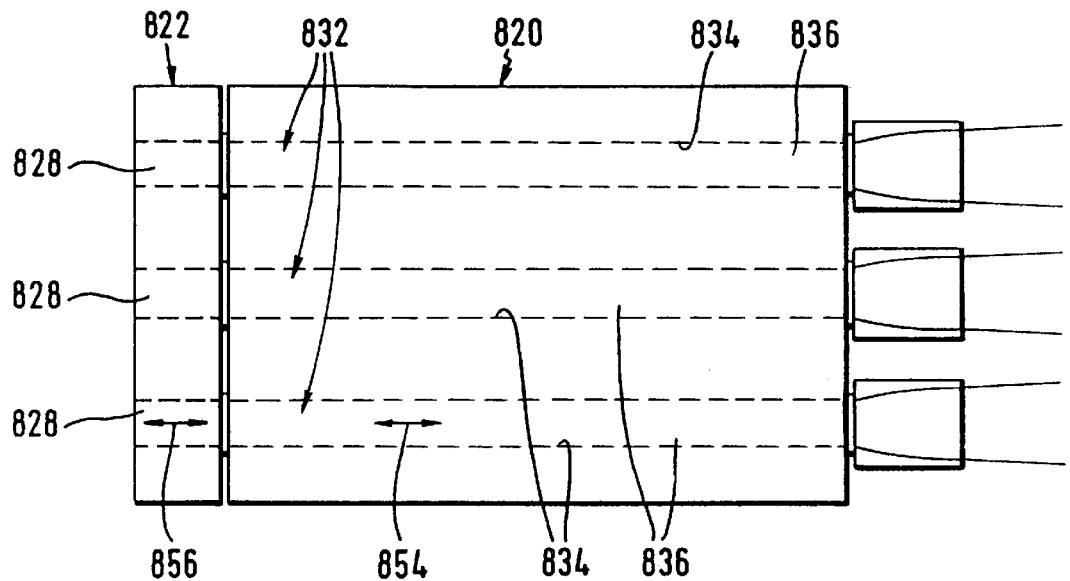
FIG. 17 a top view of a first embodiment of an array consisting of semiconductor emitters comprising radiation sources and subsequently disposed frequency doublers.
Figure 18:
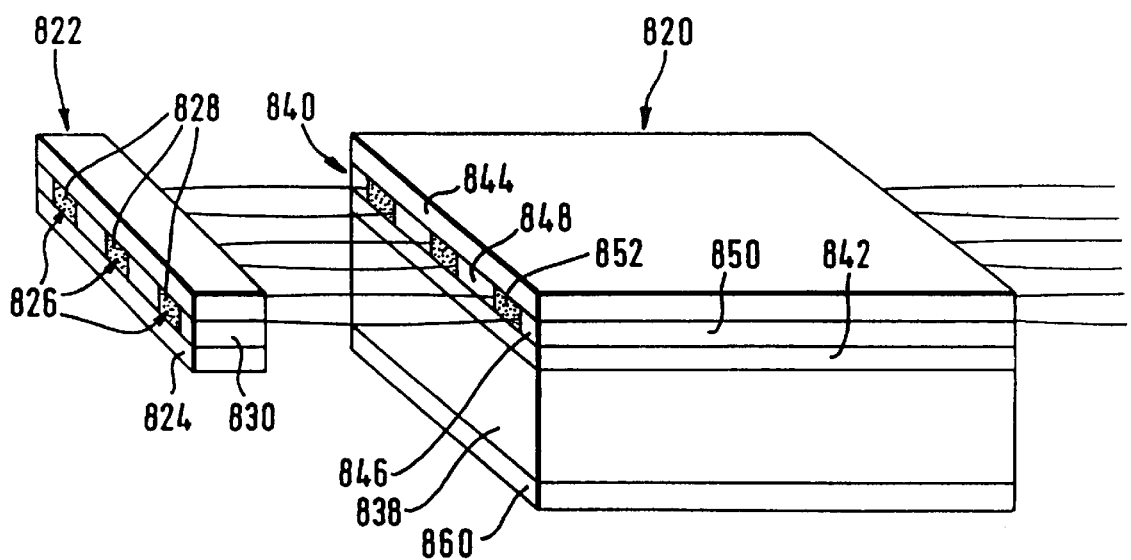
FIG. 18 a perspective, exploded illustration of the array of radiation sources and of the array of frequency doublers in accordance with FIG. 17.

An embodiment of a semiconductor emitter of this type, which doubles the wavelength of the radiation from the radiation source and which is referenced as a whole by 820 in FIGS. 17 and 18, comprises an array 822 of edge emitters 826 that are arranged on a common substrate 824 and are formed by special active laser layers arranged on the common substrate 824 and that each comprise a strip shaped area 828 of a continuous layer 830 that is arranged on the common substrate 824 as the active laser layer 802.

A respective frequency doubler 832, which comprises a respective waveguide structure 834 in which a frequency doubling medium is arranged as the waveguide core 836, is associated with each of the semiconductor lasers 826 serving as a radiation source.

Here, the waveguide structure 834 guides the radiation produced by the respective semiconductor laser 826 with a cross-section that has been contracted in such a way that a power density of at least $10^5 W/cm^2$, preferably at least $10^6 W/cm^2$, which is required for an efficient frequency doubling in the frequency doubling medium, is achieved.

In the embodiment illustrated in FIGS. 17 and 18, all of the frequency doublers 832 are likewise arranged on a common substrate 838 in the form of an array 840.

The waveguide structures 834 are formed here by a base layer 842 and a covering layer 844 which represent the upper and lower walls of the waveguide channel 834, and also strip areas 846 and 848 of an intermediate layer 850, which strip areas are spaced apart from one another, form the side walls of the waveguide channel 834 and enclose therebetween a strip area 852 of the intermediate layer 850 which forms the frequency doubling medium 836 serving as the waveguide core.

The base layer 842, the covering layer 844 and also the strip shaped areas 846 and 848 of the intermediate layer 850 have a refractive index which is smaller than the refractive index of the strip shaped area 852 so that a total reflection of the radiation occurs at the borders between the strip shaped area 852 and the layers 842 and 844 as well as the strip shaped areas 846 and 848 and hence there results a guidance of the radiation in the waveguide structure 834.

The semiconductor emitter is preferably constructed such that the array 840 of frequency doublers 832 is directly adjacent to the array 822 of semiconductor lasers 826 so that radiation from the active laser layers 828 transfers directly into the waveguide channels 834.

It is propitious here, if the dimensions of the waveguide structures 834 transversely to their longitudinal direction 854 are selected to be approximately equal to the dimensions of the active laser areas 828 transversely to the direction of propagation 856 of the laser radiation.

In order to achieve an efficient frequency doubling in the frequency doubling medium 836, the fundamental wave, i.e. the radiation coming from the corresponding semiconductor laser 826, and the frequency doubled radiation have to remain in phase during the whole of their passage through the frequency doubling medium. This is then optimally achieved when one works with an uncritical or non-critical phase matching in which the angle amounts to 0° or 90°.

This is only possible at a few wavelengths. The achievement of a match at the corresponding wavelength is preferably effected for the respective material by means of a variation of the temperature so that the substrate 838 rests on a temperature regulating device 860 for example with which the whole array 840 of frequency doublers 832 can be brought up to the optimum temperature for a uncritical phase matching and retained thereat.

The subject of uncritical or non-critical phase matching is described in detail in the book by W. Koechner "Solid State Laser Engineering" so that, in respect thereof, reference is made to the full contents of this reference source.

The temperature regulating device 860 is preferably provided with a control means by means of which a predetermined temperature can be set and maintained by a servo process.

It is propitious if the direction of the crystals in the frequency doubling medium 836 is determined by the orientation of the substrate 838, this being oriented such that the optical axes of the substrate are oriented in the desired direction relative to the longitudinal direction 854 of the waveguide channel 834. If one grows the layers 842, 844 and 850 on this substrate 838 from the same basic material, possibly using different dopings, then these layers have the same orientation of the optical axes as the substrate 838 and, as a consequence, the siting of the optical axes in the frequency doubling medium 836 can thus be predetermined.

Figure 19:
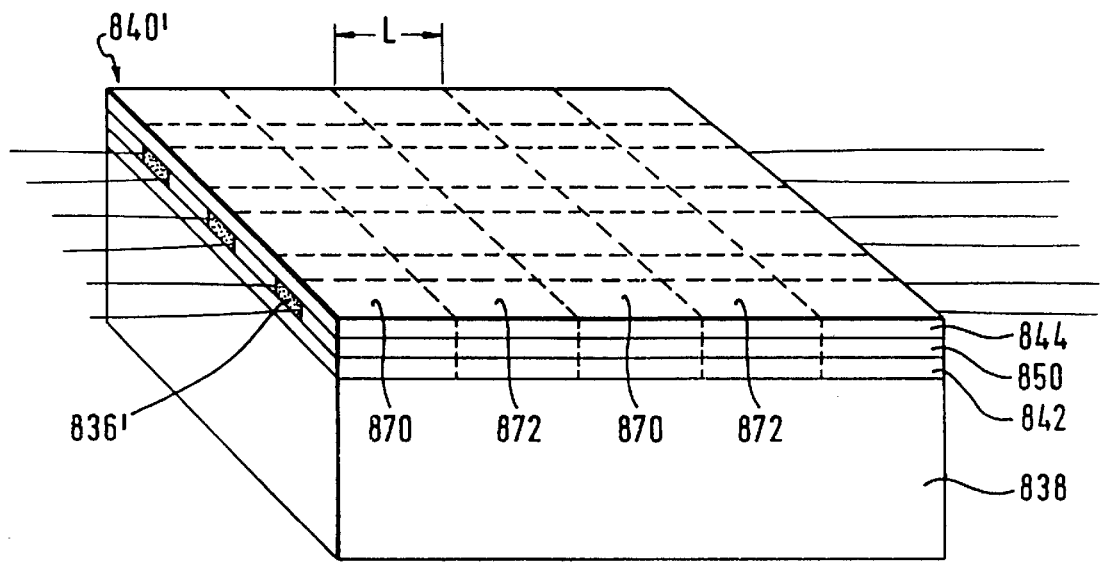
FIG. 19 a variant of the array of frequency doublers in accordance with the first embodiment.

In a variant 840' of the array 840 of frequency doublers 832 which is illustrated in FIG. 19, one does not work with uncritical phase matching but rather, the phase matching is achieved in that domains 870 and 872, in which the non-linear coefficients of the frequency doubling medium 836 have respectively reversed prefix signs, succeed one another in the frequency doubling medium 836'.

Here, an extension L of the domains 870 and 872 in the longitudinal direction 854 of the waveguide channels 834 has to be tuned such that it corresponds to the coherence length.

By using a quasi-phase-matching of this type, one can achieve, beyond the ideal phase matching, a phase matching which ensures a sufficient intensity of the frequency doubled radiation when frequency doubling is involved.

The subject of quasi-phase-matching is described in detail in the periodical, Optics Letters Vol 17, No 11, pages 795 to 797, in the periodical, Applied Physics Letters 56 (2), pages 108 to 110 or, in the IEEE Journal of Quantum Electronics Vol 28, No 11 pages 2631 to 2654.

The array 840' is otherwise constructed in the same manner as the array 840 so that one can refer in full to the explanations in respect thereof and one will find that the same reference symbols have been used for the same elements.

Preferably, in the case of the uncritical phase matching, a crystal consisting of lithium niobate for the wavelengths green and red and a crystal consisting of potassium niobate for the wavelength blue can be used as the frequency doubling medium.

The waveguide structure 834 is produced by making the material which surrounds the waveguide core from lithium niobate or potassium niobate which has been additionally doped with magnesium or with other elements lowering the refractive index.

Figure 20:
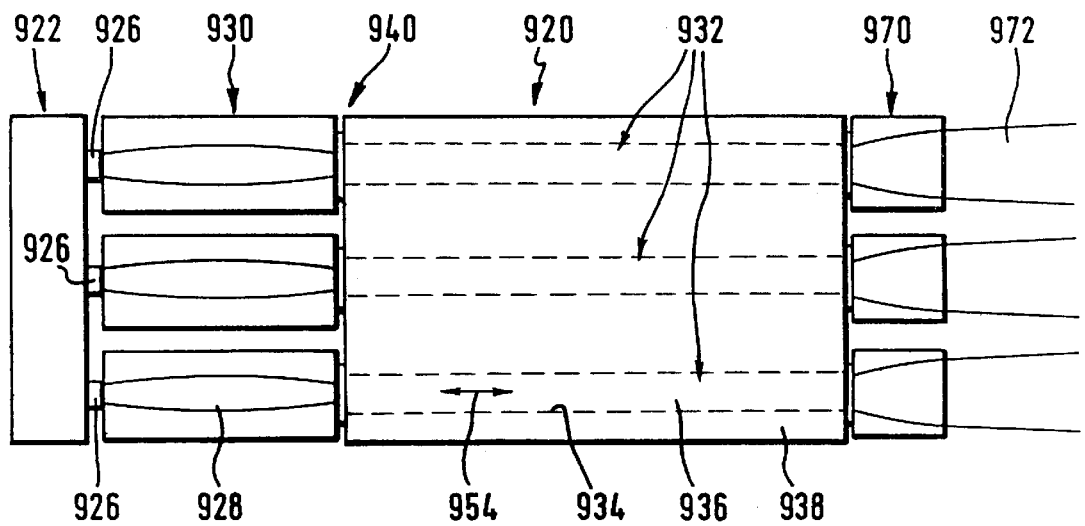
FIG. 20 a second embodiment of an array of semiconductor emitters formed by radiation sources and frequency doublers as well as of an optical means inserted therebetween.

In a second embodiment of a semiconductor emitter in accordance with the invention which is illustrated in FIG. 20 and which is referenced as a whole by 920, use has been made of an array 922 of semiconductor lasers 926 formed as vertical emitters. The radiation 928 from these semiconductor emitters is focused by means of focusing elements 930 on frequency doublers 932 which are likewise arranged in an array 940 on a common substrate and which are formed and constructed in the same manner as the array 840 so that one can refer in full to the explanations in respect thereof. Here, the focusing optical system 930 is not formed as an optical lens system but rather, as graded-index lenses which are inserted as a block between the respective semiconductor lasers 926 and the corresponding frequency doublers 932 and which focus the radiation 928 onto the waveguide channels 934 by virtue of the graded index.

In addition, optical expansion means 970 are preferably arranged on the end faces of the frequency doublers 932, which means are likewise graded-index lenses that produce a substantially parallel beam 972.

What is claimed is:

1. Apparatus for generating an image in an image plane that is visible for a human eye, comprising:

a plurality of semiconductor emitters in a two-dimensional array for providing a corresponding two-dimensional array of outlet spots as light sources;

each of said outlet spots emitting radiation at one out of three different wavelengths, wherein the superposition of radiation at said three different wavelengths allows the generation of white light;

an optical projection system which receives radiation from said outlet spots and projects the radiation from said outlet spots on said image plane as a two-dimensional array of image areas;

each image area comprising three incongruent partial imaging spots;

each of said incongruent partial imaging spots being illuminated at a different wavelength which allows the image area to be illuminated such that the image area appears as one of colored and white for the averaging human eye;

and said optical projection system associating each of said three incongruent partial imaging spots with one out of three different outlet spots, each of said three different outlet spots emitting radiation at one out of said three different wavelengths, wherein each of said three outlet spots emits radiation at a wavelength which is different from the wavelengths of said two other outlet spots.

2. An apparatus in accordance with claim 1, wherein: said optical projection system forms an image of the radiation from the three semiconductor emitters, which radiate at different wavelengths, at each image area by illuminating three partial imaging spots thereof in a temporally incongruent manner.

3. An apparatus in accordance with claim 1, wherein: said optical projection system forms an image of the radiation from the three semiconductor emitters, which radiate at different wavelengths, at each image area by illuminating three partial imaging spots thereof which are arranged in a spatially incongruent manner.

4. An apparatus in accordance with claim 1, wherein: the number of semiconductor emitters is so large that, at a given point in time, each imaging spot of the row of images is exclusively associated with a corresponding outlet spot of the semiconductor emitters.

5. An apparatus in accordance with claim 1, further comprising:
control means for providing electrical charges to said semiconductor emitters for individually controlling the intensity of the outlet spots.

6. An apparatus in accordance with claim 5, wherein: said control means provides electrical charges to said semiconductor emitters to cause the emitters to emit radiation in a time period between two successive control time points.

7. An apparatus in accordance with claim 6, wherein: said control means provides electrical charges to said semiconductor emitters to cause the emitters to emit radiation in successive constant time periods between successive control time points.

8. An apparatus in accordance with claim 5, wherein: the semiconductor emitters emit the radiation with an individually variable adjustable intensity.

9. An apparatus in accordance with claim 8, wherein: the semiconductor emitters emit the radiation with a set intensity which is substantially unaltered between two control time points.

10. An apparatus in accordance with claim 8, wherein: said control means provides electrical charges to said semiconductor emitters to set the intensity of the radiation from each semiconductor emitter at each control time point.

11. An apparatus in accordance with claim 6, wherein: between the control time points, the semiconductor emitters either emit the radiation with maximum intensity but with an individually variable adjustable duration or do not emit any radiation.

12. An apparatus in accordance with claim 11, wherein: the setting of an average intensity, which is perceptible by an observer, is effected by modulating the duration of the emission of the radiation.

13. An apparatus in accordance with claim 11, wherein: the setting of the duration of the emission of the radiation occurs at each control time point.

14. An apparatus in accordance with claim 6, wherein: for the semiconductor emitters of one row of light sources, at least those which are associated with one tenth of the imaging spots of a row of images are controlled at the same control time point.

15. An apparatus in accordance with claim 14, wherein: the semiconductor emitters of a row of light sources which are associated with all of the imaging spots of a row of images are controlled at the same time.

16. An apparatus in accordance with claim 6 further comprising:
a buffer store, from which the control parameters are read-out in parallel for the simultaneous control of said plurality of semiconductor emitters.

17. An apparatus in accordance with claim 16, wherein: the buffer store records the control parameters for the semiconductor emitters between two successive control time points.

18. An apparatus in accordance with claim 17, wherein: the control parameters are serially read in the buffer store.

19. An apparatus in accordance with claim 16, wherein: the control parameters are produced by an image generator.

20. An apparatus in accordance with claim 19, wherein: the image generator generates the control parameters in serial fashion.

21. An apparatus in accordance with claim 16, further comprising:
a control means associated with each of the semiconductor emitters for storing the control parameters from one control time point to the next control time point.

22. An apparatus in accordance with claim 1, wherein: each imaging spot is illuminated by a single semiconductor emitter.

23. An apparatus in accordance with claim 11, wherein: each image area is illuminated by at least three semiconductor emitters, each of which emits radiation at a wavelength which is such that white light is produced by superimposing the radiation from the three semiconductor emitters.

24. An apparatus in accordance with claim 23 wherein: the three semiconductor emitters respectively illuminating one imaging spot are each be controlled at the same time.

25. An apparatus in accordance with claim 23, wherein: the optical projection system combines the radiation from the three semiconductor emitters which radiate at different wavelengths into one beam.

26. An apparatus in accordance with claim 1, wherein: the row of light sources comprises at least one row of semiconductor emitters which emit radiation of the same wavelength.

27. An apparatus in accordance with claim 26, wherein: for the illumination of the imaging spots of a row of images, the row of light sources comprises three rows of semiconductor emitters which run in parallel with one another, wherein the semiconductor emitters of each row emit radiation of substantially the same wavelength.

28. An apparatus in accordance with claim 1, wherein: the optical projection system successively forms an image of a row of light sources as a plurality of rows of images.

29. An apparatus in accordance with claim 28, wherein:
the optical projection system comprises a beam deflecting element which forms the image of a row of light sources as successive rows of images.

30. An apparatus in accordance with claim 29, wherein:
the beam deflecting element is a movable reflecting element.

31. An apparatus in accordance with claim 30, wherein:
reflecting element is moved into defined angular positions which respectively form the image of the row of light sources in a respective one of the rows of images.

32. An apparatus in accordance with claim 29, wherein:
the beam deflecting element is formed by a rotating polygonal reflector.

33. An apparatus in accordance with claim 32, wherein:
the polygonal reflector rotates at a constant rotational speed.

34. An apparatus in accordance with claim 33, wherein:
said polygonal reflector has a plurality of polygonal surfaces; and
for each polygonal surface of the polygonal reflector, the polygonal reflector traverses across the number of rows of images by rotation through a particular angular range and then changes over to the next polygonal surface.

35. An apparatus in accordance with claim 29, wherein:
the optical projection system focuses the radiation from the semiconductor emitters of the row of light sources substantially onto the beam deflecting element.

36. An apparatus in accordance with claim 1, wherein:
a row of light sources is associated with each row of images.

37. An apparatus in accordance with claim 36, wherein:
the optical projection system forms the image of the plurality of rows light sources as a plurality of rows of images.

38. An apparatus in accordance with claim 1, wherein:
the optical projection system produces imaging spots which have a small separation from one another.

39. An apparatus in accordance with claim 38, wherein:
the imaging spots substantially border onto one another.

40. An apparatus in accordance with claim 1, wherein:
each semiconductor emitter comprises a semiconductor radiation source and a frequency doubler for the radiation emitted by the semiconductor radiation source.

41. An apparatus in accordance with claim 40, wherein:
each of the frequency doublers comprises a waveguide structure which guides the radiation from each radiation source in a compressed manner with a power density of at least $10^5 W/cm^2$ and a frequency doubling medium arranged in the waveguide structure.

42. An apparatus in accordance with claim 41, wherein:
the frequency doubling medium is so formed, and, as regards its optical axes, it is so aligned relative to the channel of the waveguide that there results an uncritical phase matching between the radiation and the frequency doubled radiation in the longitudinal direction of the waveguide structure.

43. An apparatus in accordance with claim 42, wherein:
the frequency doubling medium can be brought up to a defined temperature.

44. An apparatus in accordance with claim 41, wherein:
the frequency doubling medium is so formed, and is so aligned, that there results a quasiphase-matching in the longitudinal direction of the waveguide structure.

45. An apparatus in accordance with claim 40, wherein:
the frequency doublers are directly adjacent to the respective radiation sources.

46. An apparatus in accordance with claim 40, wherein:
an optical means, which focuses the radiation into the waveguide structure, is arranged between each radiation source and each respective frequency doubler.

47. An apparatus in accordance with claim 40, wherein:
the radiation sources of a row of light sources are arranged in a row, and the frequency doublers of the row of light sources are arranged, likewise in a row, at the outlet sides of the radiation sources.

48. An apparatus in accordance with claim 40, wherein:
a plurality of the radiation sources are arranged on a common substrate.

49. An apparatus in accordance with claim 40, wherein:
a plurality of the frequency doublers are arranged on a common substrate.

50. An apparatus in accordance with claim 40, wherein:
each waveguide structure of each frequency doubler is a single mode waveguide.

51. An apparatus in accordance with claim 40, wherein:
each waveguide structure is formed by a wall material which surrounds the frequency doubling medium forming the core of the waveguide and which has a lower refractive index than the core of the waveguide.

52. An apparatus in accordance with claim 51, wherein:
the wall material is based on the same material as the frequency doubling medium and has a lower refractive index than the frequency doubling medium due to a different doping.

53. An apparatus in accordance with claim 52, wherein:
the waveguide structure is formed by doping those regions that form the wall material in a material which is identical to the frequency doubling medium.

54. An apparatus in accordance with claim 51, wherein:
the waveguide structure is formed by layers which are applied to a substrate and which comprise the wall material.

55. An apparatus in accordance with claim 40, wherein:
the frequency doubling medium is formed by a layer which is applied to a substrate.

56. An apparatus in accordance with claim 55, wherein:
a defined alignment of optical axes of the frequency doubling medium is predetermined by an alignment of the substrate.

57. Apparatus for generating an image in an image plane that is visible for a human eye, comprising:
a plurality of semiconductor emitters in a two-dimensional array for providing a corresponding two-dimensional array of outlet spots as light sources;
each of said outlet spots emitting radiation at one out of three different wavelengths, wherein the superposition of radiation at said three different wavelengths allows the generation of white light;
an optical projection system which receives radiation from said outlet spots and simultaneously projects the radiation from all of said outlet spots on said image plane as a two-dimensional array of image areas;
each image area comprising three spatially incongruent partial imaging spots;
each of said incongruent partial imaging spots being illuminated at a different wavelength which allows the image area to be illuminated such that the image area appears as one of colored and white for the averaging human eye; and said optical projection system associating each of said three incongruent partial imaging spots with one out of three different outlet spots, each of said three different outlet spots emitting radiation at one out of said three different wavelengths, wherein each of said three outlet spots emits radiation at a wavelength which is different from the wavelengths of said two other outlet spots.

58. Apparatus for generating an image in an image plane that is visible for a human eye, comprising:

a plurality of semiconductor emitters in a two-dimensional array for providing a corresponding two-dimensional array of outlet spots as light sources;

each of said outlet spots emitting radiation at one out of three different wavelengths, wherein the superposition of radiation at said three different wavelengths allows the generation of white light;

an optical projection system which receives radiation from said outlet spots and projects the radiation from said outlet spots on said image plane as a two-dimensional array of image areas;

each image area comprising three temporally incongruent partial imaging spots which are illuminated one after the other;

each of said partial imaging spots being further illuminated at a different wavelength which allows the image area to appear as one of colored and white for the averaging human eye;

and said optical projection system associating each of said three partial imaging spots with one out of three different outlet spots, each of said three different outlet spots emitting radiation at one out of said three different wavelengths, wherein each of said three outlet spots emits radiation at a wavelength which is different from the wavelengths of said two other outlet spots.

59. An apparatus in accordance with claim 58, wherein:

said two-dimensional array of light sources is built-up by rows of semiconductor emitters in a way that each row of light sources comprises three rows of semiconductor emitters which respectively produce radiation of different wavelengths, including at least one of red, green and blue.

60. An apparatus in accordance with claim 59, wherein:

each row of semiconductor emitters which produce radiation of the same wavelength is driven one after the other and switched onward from one row of light sources to the next following row of light sources in a way that the three semiconductor emitters illuminating the same imaging spot illuminate said imaging spot one after the other.

61. An apparatus in accordance with claim 60, wherein:

said optical projection system forms an image of the radiation from the three semiconductor emitters, which radiate at different wavelengths, at three partial imaging spots which are arranged in a spatially incongruent manner.

62. An apparatus in accordance with claim 60, wherein:

said optical projection system forms an image of the radiation from the three semiconductor emitters, which radiate at different wavelengths, at three partial imaging spots which are arranged in a spatially congruent manner.

63. An apparatus in accordance with claim 1, wherein:

said optical projection system forms an image of the radiation from the three semiconductor emitters, which radiate at different wavelengths, at each image area by successively illuminating three partial imaging spots thereof one after another.

64. An apparatus in accordance with claim 1, wherein:

said optical projection system forms an image of the radiation from the three semiconductor emitters, which radiate at different wavelengths, at each image area by illuminating three partial imaging spots thereof which are either partially overlapping or non-overlapping with one another.

* * * * *